US006195775B1

(12) United States Patent
Douskey et al.

(10) Patent No.: US 6,195,775 B1
(45) Date of Patent: Feb. 27, 2001

(54) BOUNDARY SCAN LATCH CONFIGURATION FOR GENERALIZED SCAN DESIGNS

(75) Inventors: Steven Michael Douskey; Paul Allen Ganfield; Daniel Guy Young, all of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/145,724

(22) Filed: Sep. 2, 1998

(51) Int. Cl.[7] .................................................. G01R 31/28
(52) U.S. Cl. ................................................. 714/727
(58) Field of Search .................................. 714/727, 726, 714/733

(56) References Cited

U.S. PATENT DOCUMENTS

| | | | |
|---|---|---|---|
| 4,340,857 | 7/1982 | Fasang | 714/733 |
| 4,377,757 | 3/1983 | Könemann et al. | 326/16 |
| 4,433,413 | 2/1984 | Fasang | 714/732 |
| 4,513,418 | 4/1985 | Bardell, Jr. et al. | 714/726 |
| 5,018,144 | 5/1991 | Corr et al. | 714/731 |
| 5,546,406 | * 8/1996 | Gillenwater et al. | 714/733 |
| 5,570,375 | * 10/1996 | Tsai et al. | 714/727 |
| 5,612,963 | 3/1997 | Koenemann et al. | 714/739 |
| 5,617,426 | 4/1997 | Koenemann et al. | 714/726 |
| 5,663,966 | 9/1997 | Day et al. | 714/731 |
| 5,726,999 | * 3/1998 | Bradford et al. | 714/727 |
| 5,732,091 | * 3/1998 | Whetsel | 714/727 |

OTHER PUBLICATIONS

Maunder et al. Testabilty on TAP, IEEE, p. 34–37, Feb. 1992.*
Fitch et al., Application of Boundary–Scan and Full–Chip BIST to A# ASIC Chip Set, IEEE, pp. 17.5.1–17.5.4, 1991.*
Setty et al., BIST and Interconnect Testing with Boundary Scan, IEEE, p. 12–15, 1991.*
IEEE Standard Test Access Port and Boundary—Scan Architecture, *IEEE Computer Society*, IEEE Std 1149.1–1990 (Includes IEEE Std 1149.1a–1993), pp. 7–8 to 7–22 (Oct. 21, 1993).

* cited by examiner

*Primary Examiner*—Albert De Cady
*Assistant Examiner*—Shelly A Chase
(74) *Attorney, Agent, or Firm*—Min Xu; Mark A. Hollingsworth

(57) ABSTRACT

A boundary configuration (Common Input/output CIO) for Generalized Scan Designs (GSD) in a single clock chip design includes at least one generalized scan design internal latch; a boundary scan clock input to the internal latch; an input/output cell connected to the internal latch; and at least one control line between the internal latch and the input/output cell. The CIO GSD is arranged and configured to operate in various modes including a function mode, a RUNBIST/INTEST/LBIST mode, an EXTEST/WIRETEST mode, a SAMPLE/PRELOAD mode, etc. In a different version, a MUX controller is connected to the internal latch. The MUX controller selects data from one of at least two control lines and sending the selected data to at least one internal logic unit of the chip for a test operation.

28 Claims, 24 Drawing Sheets

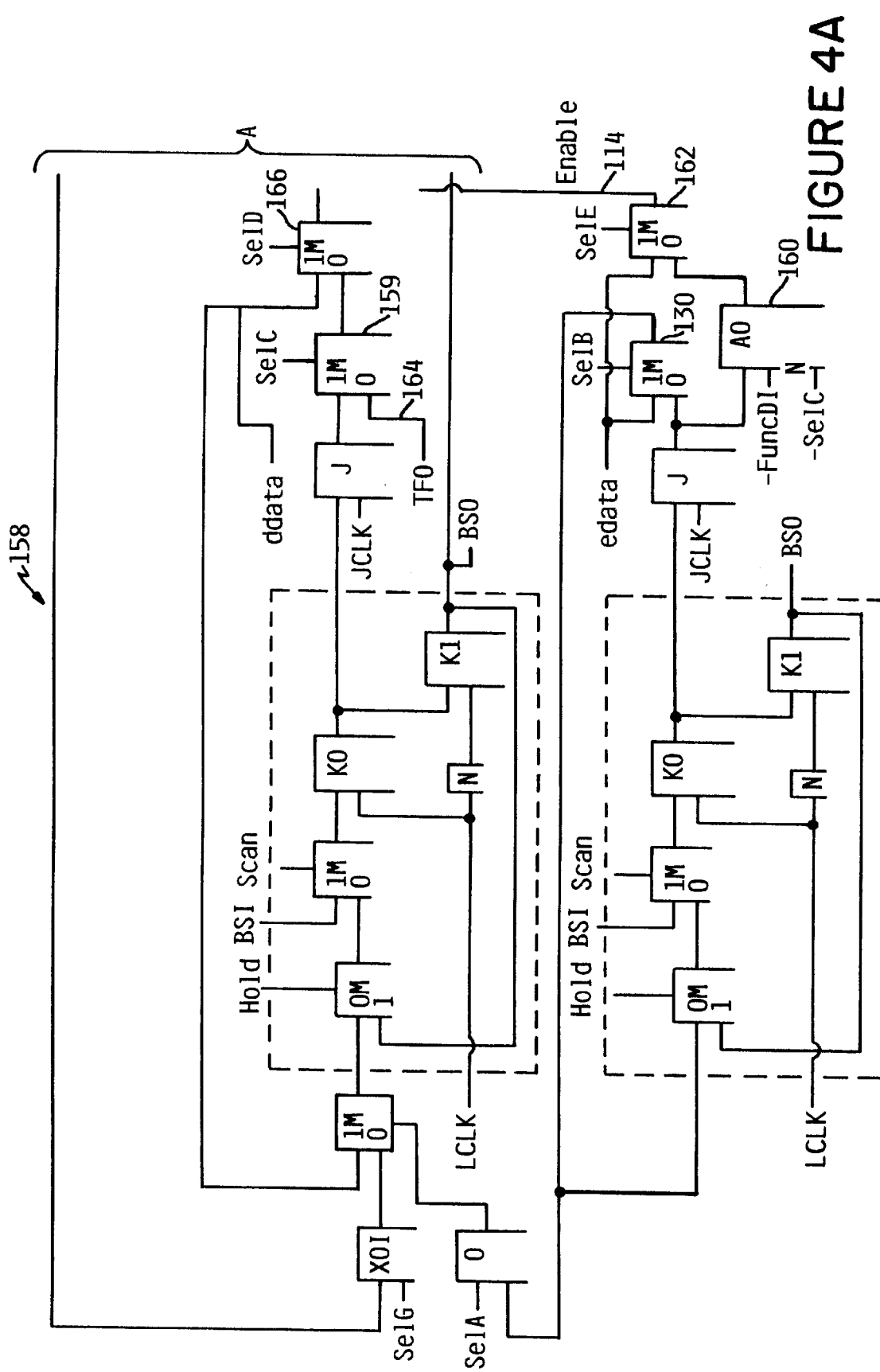

BOUNDARY SCAN LATCH CONFIGURATION FOR GENERALIZED SCAN DESIGNS

FIELD OF THE INVENTION

The present invention relates generally to a boundary design of a chip. More particularly, the present invention relates to a boundary scan latch configuration for generalized scan designs in a single clock chip design.

BACKGROUND OF THE INVENTION

In designing large scale integration (LSI) circuits or very large scale integration (VLSI) circuits, one important step is to incorporate testing circuits for the designs. The principle is to design testing methods concurrently with the architectural considerations of the designs as opposed to be left until fabricated chip or components of the chip have been made. This manufacturing test principle has been well recognized by the LSI and VLSI design industry and is commonly called Design For Test (DFT).

The testing of large scale integration (LSI) packages, very large scale integration (VLSI) packages, and application-specific integrated circuits (ASIC) has become increasingly important as these components and circuits continue to increase in gate densities. One well known testing scheme is called Logic Built-In Self-Test (LBIST). LBIST is accomplished using a LBIST controller which scans data to functional logic units on the chip, cycles system clocks and receives output data from the chip via scanning. The outputted data is compressed and compared with the expected data so as to determine the accuracy of the chip design and the performance thereof. Two other types of tests often referred to as INTEST and RUNBIST are similar to the LBIST. INTEST and RUNBIST are standard tests defined by IEEE 1149.1 Standard (hereinafter referred to "Standard"). They are optional tests that allow testing of an on-chip system logic. Another Standard test is called EXTEST. EXTEST is a mandatory Standard function that allows testing off-chip data paths. There are many similar off-chip tests, one of which is referred to WIRETEST which has a minor modification to the EXTEST to reduce test patterns. A further mandatory Standard function is called SAMPLE/PRELOAD. SAMPLE/PRELOAD allows taking a snapshot of a normal operation of the chip. Lastly, each chip, besides operating in its various test modes and a SAMPLE/PRELOAD mode, operates a function mode, that is a normal customer use mode or a function logic mode in a normal operation. Details of the Standard modes for EXTEST, RUNBIST, INTEST and SAMPLE/PRELOAD can be found in the "IEEE Standard Test Access Port and Boundary-Scan Architecture" (published by IEEE, STD 1149.1-1990, including STD 1149.1A-1993, Oct. 21, 1993, ISDN 1-55937-350-4).

To implement the above various modes, the boundary configuration of a chip, e.g. Inputs or Outputs or Common Inputs/Outputs (CIO), has also to be redesigned to accommodate these and other modes.

In addition, in a chip design, clock designs and clock signal distribution networks continue to evolve as faster chips are required. Accordingly, a single clock distribution with a minimal gating at the ends of the trees (e.g. at the chip boundary) is desired. As a result, a single clock and gates replace the multiple system and scan clocks used in conventional chip designs. However, this single clock requirement complicates the chip design for the boundary configuration, especially when the boundary configuration adapts for boundary scan latch configuration with GSD as there is a need for supporting a Standard Clock (or TCK). The TCK clock generally performs on the Standard's Test Access Port (TAP). For a boundary scan, the functions include: scanning data in and out of the Boundary Scan Scan Chain, Sampling Data into the Boundary Scan latches, and driving data from the Boundary Scan latches in selected modes.

Another problem is that there are limited Inputs/Outputs (I/O) in a chip. The limited I/O count further requires a creative boundary configuration that allows sharing functional I/O with test I/O pins.

Therefore, there is a need to design a scannable boundary configuration in a single clock environment for different function and test modes. There is also a need to design a scannable boundary configuration for Generalized Scan Designs. There is further a need to design a scannable boundary configuration which shares its I/Os with test-only I/O pins. The present invention provides a solution to the above and other problems and offers advantages over conventional boundary designs.

SUMMARY OF THE INVENTION

The present invention relates generally to a boundary design of a chip. More particularly, the present invention relates to a boundary scan latch configuration for generalized scan designs in a single clock chip design.

In one embodiment of the present invention, a boundary circuit includes: at least one generalized scan design internal latch; a boundary scan clock input to the internal latch; an input/output cell connected to the internal latch; and at least one control line between the internal latch and the input/output cell.

Still in one embodiment, the internal latch includes a pair of shift register latches controlled by the boundary scan clock input, and a scan/hold control signal.

Further in one embodiment of the present invention, an inverter is connected between the input/output cell and the latch.

Yet in one embodiment of the present invention, the at least one control line controls a function mode. During a function mode, a signal is sent to/from at least one internal logic unit of the chip for a normal functional operation.

Still in one embodiment of the present invention, the at least one control line controls an INTEST/RUNBIST mode. During an INTEST/RUNBIST mode, a signal is scanned via the internal latch and sent to at least one internal logic unit of the chip for a test operation.

Additionally in one embodiment of the present invention, the at least one control line controls a LBIST mode. During a LBIST mode, a signal is scanned in via the internal latch and sent to at least one internal logic unit of the chip for a test operation. Also, during the LBIST mode, a signal from at least one internal logic unit of the chip can also be scanned out via the internal latch for analysis.

Further in one embodiment of the present invention, the at least one control line controls an EXTEST/WIRETEST mode. During an EXTEST/WIRETEST mode, a signal is scanned into the internal latch and sent to at least one external logic unit for a test operation. Also, during an EXTEST/WIRETEST mode, a signal from at least one external logic unit can be received by a receiver of the input/output cell and scanned out via the internal latch for analysis.

Yet in one embodiment of the present invention, the at least one control line controls a SAMPLE/PRELOAD mode. During a SAMPLE/PRELOAD mode, the at least one control line is driven into at least one logic unit of the chip so as to take a snapshot of a normal functional operation of the chip.

Additionally in one embodiment of the present invention, the signal can be a data signal or a control signal.

Still in one embodiment of the present invention, the at least one control line controls a driver of the input/output cell.

Further in one embodiment of the present invention, the at least one control line controls a receiver of the input/output cell.

Yet in one embodiment of the present invention, a logic unit is connected to the at least one control line such that a driver of the input/output cell is inhibitable in a test function input sharing operation. An output of a receiver of the input/output cell is shared with a test function input of the chip when the driver is inhibited.

Additional in one embodiment of the present invention, a logic unit is connected to the at least one control line such that a driver is not inhibitable in a test function output sharing operation. An input of the driver is shared with a test function output of the chip when the driver is not inhibited.

Still in one embodiment of the present invention, the boundary scan clock includes a system clock of the chip and a standard clock TCK.

In a second embodiment of the present invention, the boundary scan clock includes a standard clock TCK.

Further in the second embodiment, the boundary circuit includes a MUX controller. The MUX controller selects data from one of at least two control lines and sends the selected data to at least one internal logic unit of the chip for a test operation.

One advantage of the present invention is that it provides a boundary scan latch configuration for generalized scan designs in a single clock environment for different function and test modes. Additional advantage is that the present invention provides a scannable boundary configuration which shares its I/Os with test-only I/O pins.

These and other features and advantages of the present invention will become readily apparent to those skilled in the art from the following detailed description and corresponding drawings. As will be realized, the invention is capable of modification without departing from the invention. Accordingly, the drawing and description are to be regarded as illustrative in nature, and not as restrictive.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

The present invention relates generally to a boundary design of a chip. More particularly, the present invention relates to a boundary scan latch configuration for generalized scan designs in a single clock chip design.

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

Figure 1:
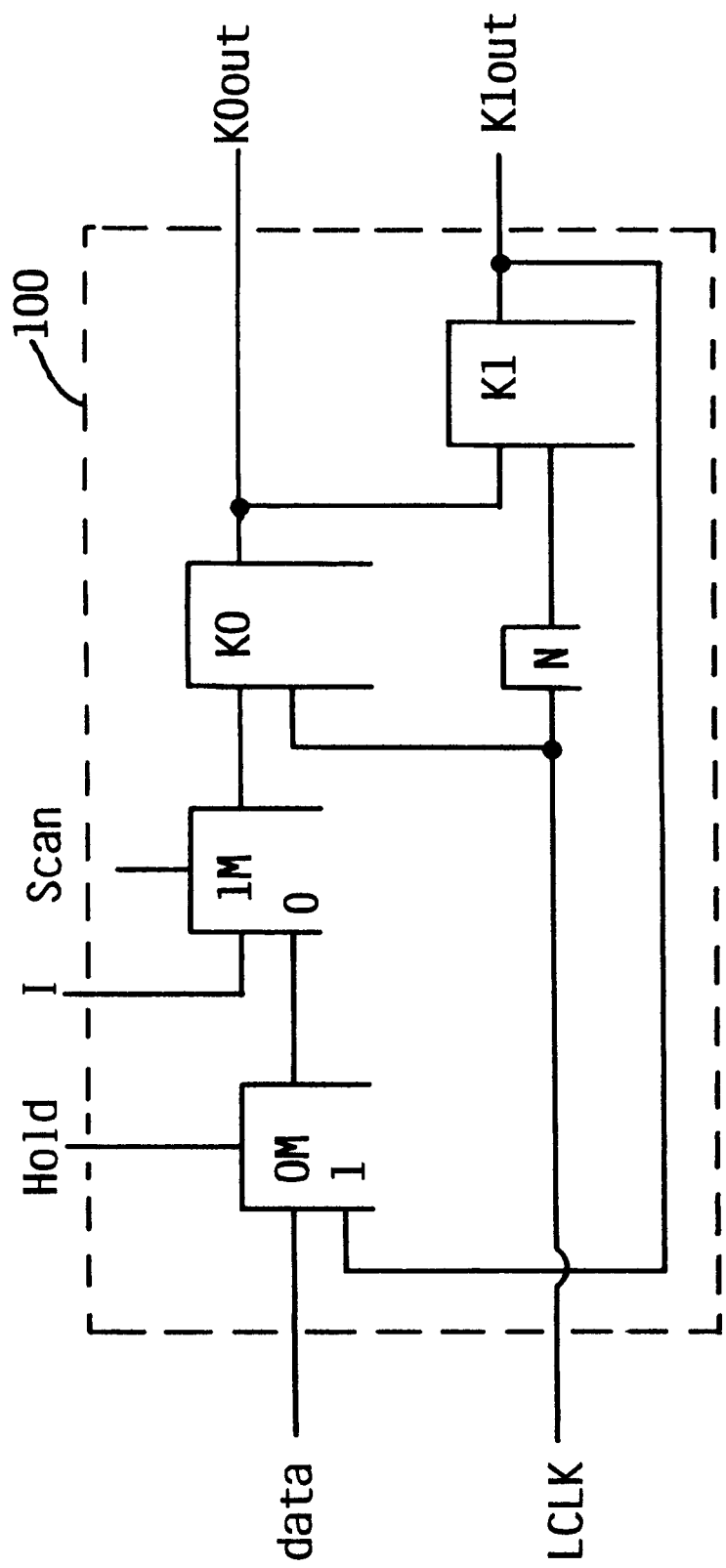
FIG. 1 is a schematic diagram of an internal latch of a Generalized Scan Design (GSD) in a single clock environment for which a boundary scan latch configuration in accordance with the present invention is adapted.

Referring to FIG. 1, it shows a general internal Generalized Scan Design (GSD) 100. The internal GSD is discussed in detail in other IBM patent applications, such as pending U.S. patent application, Ser. No. 09/076,221 (IBM RO998-05 1), filed May 11, 1998, which is hereby incorporated by reference.

The GSD latch design is used as a base for the boundary scan structure of the present invention. A system clock, LCLK, is a single, ungated clock that is distributed throughout the chip. Scanning is performed by toggling SCAN and HOLD inputs to gate the data source, rather than having separate A and B clocks as in LSSD (Level Sensitive Scan Designs). Generally, a scan at one quarter of the system clock rate would be performed by having the HOLD input ON for 3 cycles (wrapping the data in the Shift Register Latch, SRL, in this case, KO/Kl), then SCAN ON for one cycle (loading the scan data from a previous latch in the scan path or chain through an I input).

The HOLD signal is also used to eliminate the need to turn off the clock to hold the data in the SRL. The Other signals shown in FIG. 1 are simply the functional datain (data), and the two phases of dataout (K0out, K1out). The scan output is the K1out.

Note that the structure in FIG. 1 represents the logical implementation. It is appreciated that the actual physical implementations, e.g. by rearranging the MUXes (or M) and gating, may have the functional data input path through a minimum delay or may have a hold path closest to the K0 latch, and that other types of physical implementations can be used without departure from the principles of the present invention.

Boundary scan SRLs replace many of the functions previously performed through pins on a tester. For an internal testing, a driver latch samples data, while a receiver latch drives the data internally. For an external testing, the driver latch drives the chip output, while the receiver latch samples chip input data (wrapback on a Common Input/Output). Additionally, a RI (receiver inhibit) signal or a DI (Driver Inhibit) signal blocks data from leaving or entering the chip through the latched IO cell during an internal testing. When a DI input is on, the data is blocked by the IO cell from leaving the chip. When a RI input is on, the data is blocked by the IO cell from entering the chip. RI and DI signals are generally global inhibit signals over the chip.

Figures 1, 2:
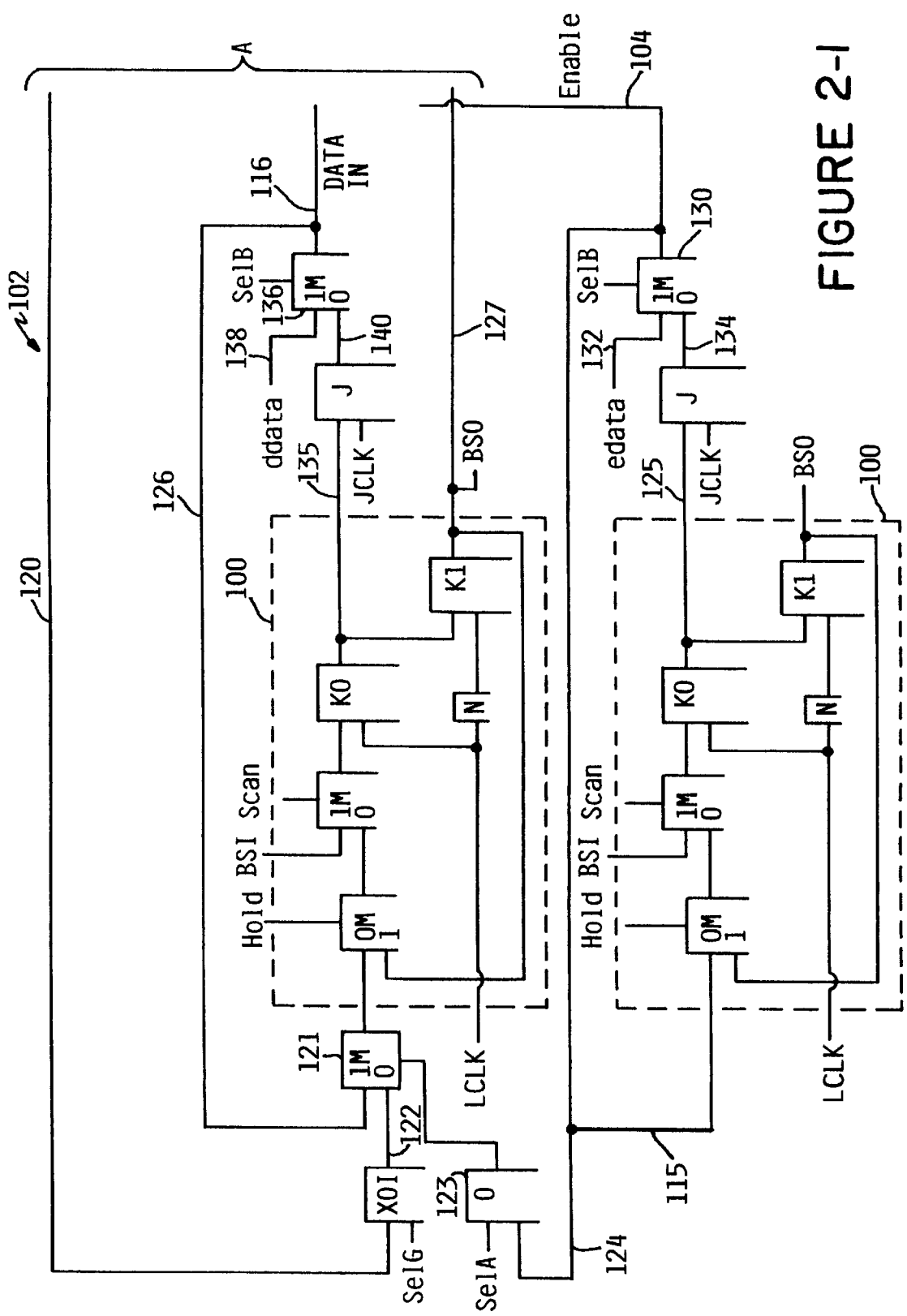
FIG. 2 is a schematic diagram of a boundary scan latch configuration having a Common Input/Output (CIO) having a Generalized Scan Design (GSD) in accordance with the present invention.
Figure 2:
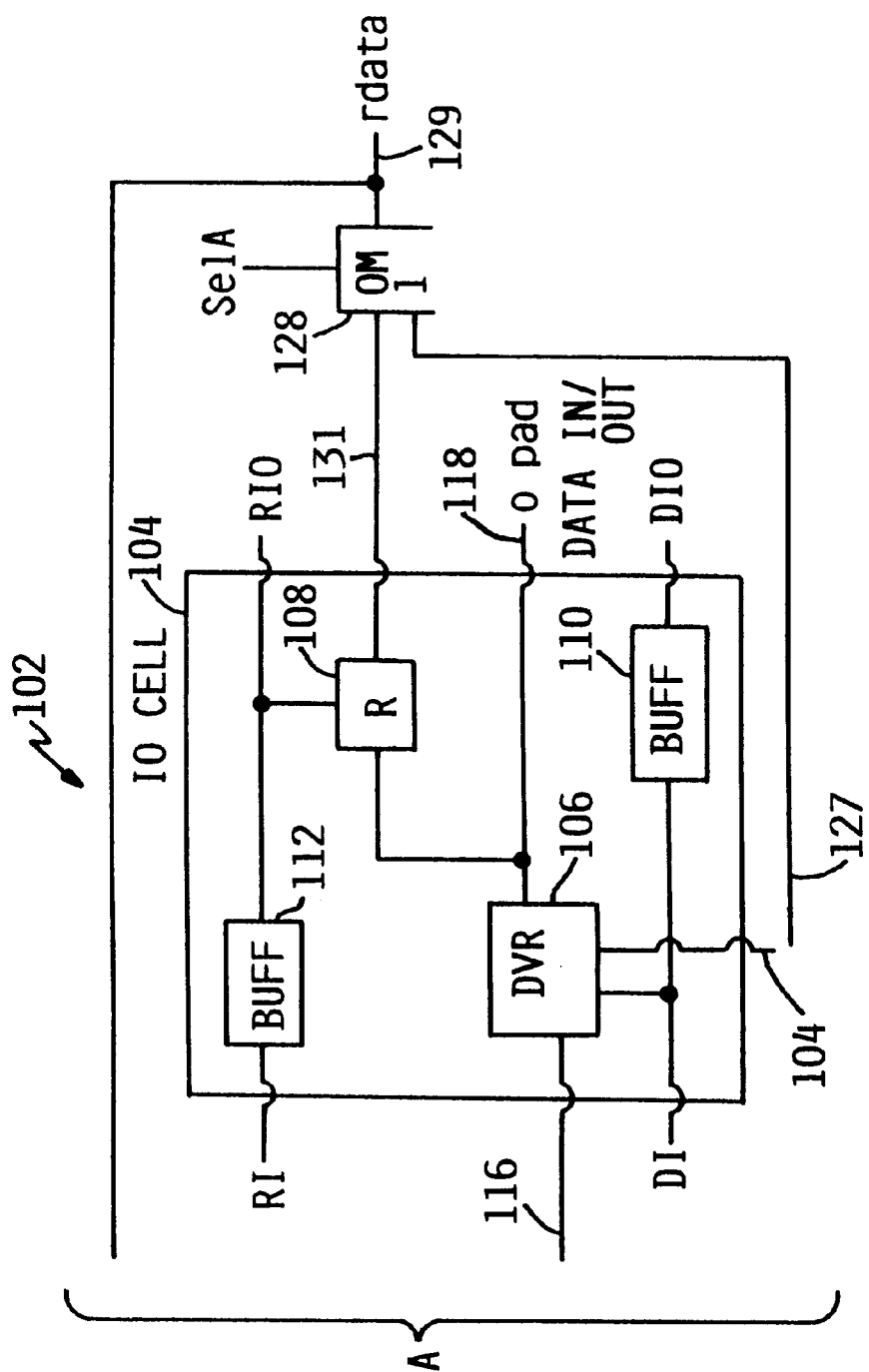

FIG. 2 shows a boundary scan latch configuration with a Common Input/Output (CIO) having a Generalized Scan Design (GSD) in accordance with the present invention. As shown, the Common Input/Output (CIO) of the boundary scan is not shared with Test Function Input (TFI) or Test Function Output (TFO), i.e. a non-shared boundary scan CIO. Later, a shared boundary scan CIO will also be discussed.

In FIG. 2, the GSD 100 is adapted at the boundary scan configuration 102. An IO cell 104 includes a driver DVR 106, a receiver R 108, and buffers BUFFs 110, 112. The IO cell 104 has an enable input from line 114 which controls the driver 106. The enable signal may control any number of drivers with the same functional enable needs, e.g. other IO cells. The IO cell 104 also contains a datain on line 116, a data in/out (or a common term "pin" or "pad") on line 118, global Driver Inhibits (DI, DIO), and global Receiver Inhibits (RI, RIO). The DIO and RIO can be used to connect to next DI and RI, respectively, in a chain. When DI is activated at the beginning of the chain, each driver of IO cells is tri-stated in the order of the chain, delayed by the previous driver by the buffer, such as BUFFs 110, 112. Similarly, the RI inhibits the receivers in succession. Generally, the buffer BUFF prevents a large number of IO cell from switching when the drivers or receivers are enabled or disabled in this or similar fashion (i.e. by DIs or RIs).

An XOI (exclusive NOR) is connected between the IO cell 104 and the GSD 100 for an improved IO wrap (feedback) testing coverage and pattern count, such that the output of the IO cell 104 is feedback via a receiver MUX 128 and line 120. A SelG control signal is the other input for the XOI. When the SelG control signal is a '1', there is no inversion of the IO feedback signal so that the IO feedback signal is outputted to a MUX, M, 121 on line 122. This complies with the Standard. When the SelG control signal is a '0', the inversion of the IO feedback signal is outputted to the M on line 122, and an IO feedback (wrap) test has complete test coverage with a minimum of test patterns. In this latter case, the XOI can also be reduced to an inverter. Therefore, if Standard compliance is not required, or if the IO wrap coverage or test length is not an issue, an inverter or wire may be used to replace the XOI as appropriate. It is appreciated that other types of physical implementations can be used within the principles of the present invention.

The MUX 121 controlled by a SelA control signal ORed (OR gate 123) with an enable path via line 124, routes data to the GSD 100 either from an internal path via line 126 during an internal test, such as LBIST, RUNBIST, or INTEST, or from the receiver MUX 128 otherwise. It is appreciated that the line 126 could be replaced with the line 138 in the RUNBIST or INTEST mode.

The dotted box is the GSD 100 having SRLs discussed earlier. To comply with the Standard, a Standard clock, TCK, is used to derive the LCLK. A JCLK input is also derived from the TCK. If the LBIST mode is implemented, it is useful to also include the system clock in the LCLK design. A J box represents another latch and is connected to the GSD 100 via line 125. This latch is used as a hold latch for SAMPLE/PRELOAD, RUNBIST, INTEST, EXTEST and WIRETEST operations. If the Standard compliance is not required, the J box and JCLK in the enable path can be eliminated, and the K1 output signal from GSD 100 in the enable path is instead sent to an enable MUX 130. In a WIRETEST mode operation without the J box, the K1 latch holds an enable data.

The enable MUX 130, controlled by a SelB control signal, routes data to the driver 106 and a first MUX of the GSD 100 either from an internal enable path (edata) via line 132 during a function mode, a SAMPLE/PRELOAD mode, and a LBIST mode operation, or from the J box/GSD latch via line 134 otherwise. The output of the enable MUX 130 may send a control signal to enable/disable the driver 106 via the line 114. The output of the enable MUX 130 may also send a feedback signal to the first MUX in the GSD 100 via line 115.

The receiver MUX 128, controlled by the SelA control signal, routes data to internal logic units (not shown) of the chip via line 129 (rdata) and the XOI via line 120, either from the GSD 100 K1 latch during a LBIST, RUNBIST, or INTEST operation via line 127, or from the receiver 108 via line 131 otherwise. The receiver 108 receives data from the data in/out pin or pad via the line 118.

Two GSDs 100 are shown in FIG. 2. One is used in the enable control path, and the other one is used in the data path. In the data path, the output of the K0 latch of the GSD 100 is inputted to a J box (latch) via line 135. A data MUX 136, controlled by the SelB control signal, routes data to the driver 106 and the MUX 121 of the corresponding GSD 100 either from an internal driver data path (ddata) via line 138 during a function mode, a SAMPLE/PRELOAD mode, or a LBIST mode operation, or from the J box/GSD latch via line 140 otherwise. The output of the data MUX 136 also routes the driver data (datain) to the driver 106 via the line 116. The driver 106 outputs the IO cell 104 at the data in/out pin or pad via the line 118. The ddata, rdata, and edata signals are the functional signals for the driver data, receiver data, and enable data, respectively.

It is appreciated that the GSDs 100 can be arranged and configured in a scan chain with an output Boundary Scan Out (BSO) of the GSD is connected to an I input (or referred to BSI, Boundary Scan Input) of the next GSD. It is also appreciated that the GSDs 100 used in the boundary scan configuration can be chain-connected to a scan chain for scanning the internal logic units.

Figure 5:
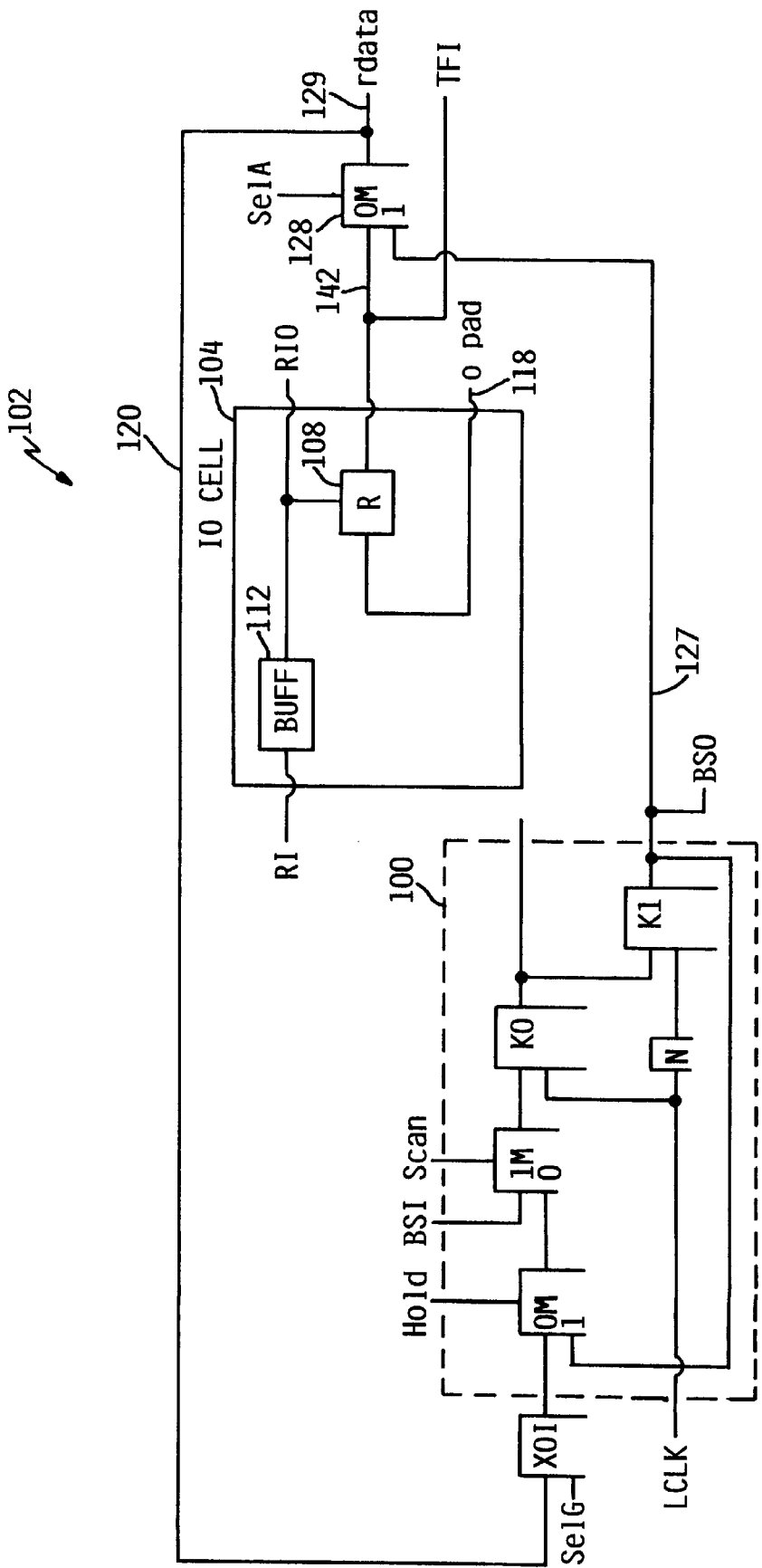
FIG. 5 is a schematic diagram of a boundary scan latch configuration having a GSD Receiver-Only (RO) sharing with TFI in accordance with the present invention.

Many of the CIO versions may be used as receiver-only functionally by just tying the ddata and edata inactive. The driver 106, the driver BUFF 110, the entire enable path can be dropped as shown in FIG. 5.

Figures 1, 2A:
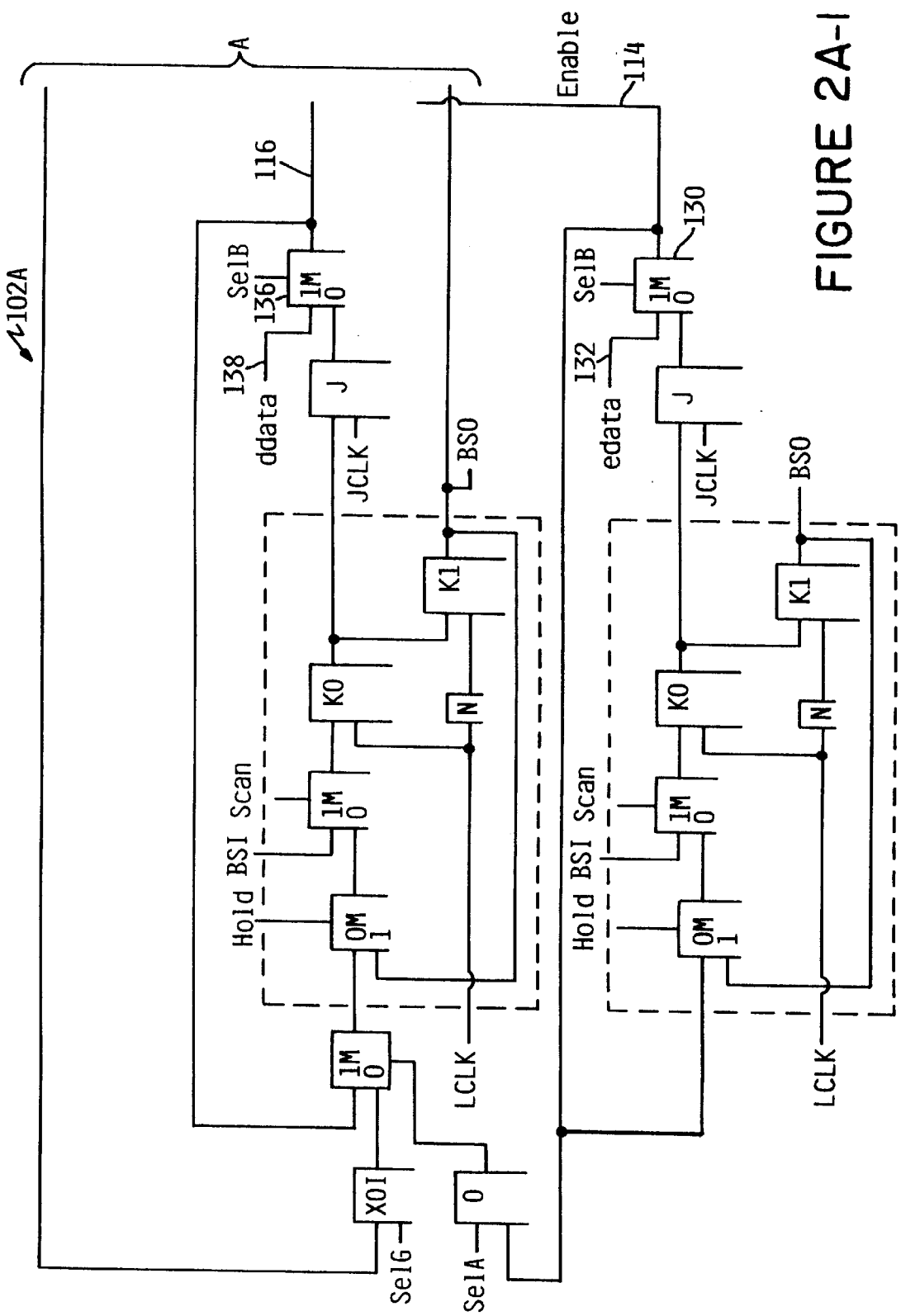
FIG. 2A is a schematic diagram of a boundary scan latch configuration having a Generalized Scan Design (GSD) of FIG. 2 in a function mode.
Figures 2, 2A:
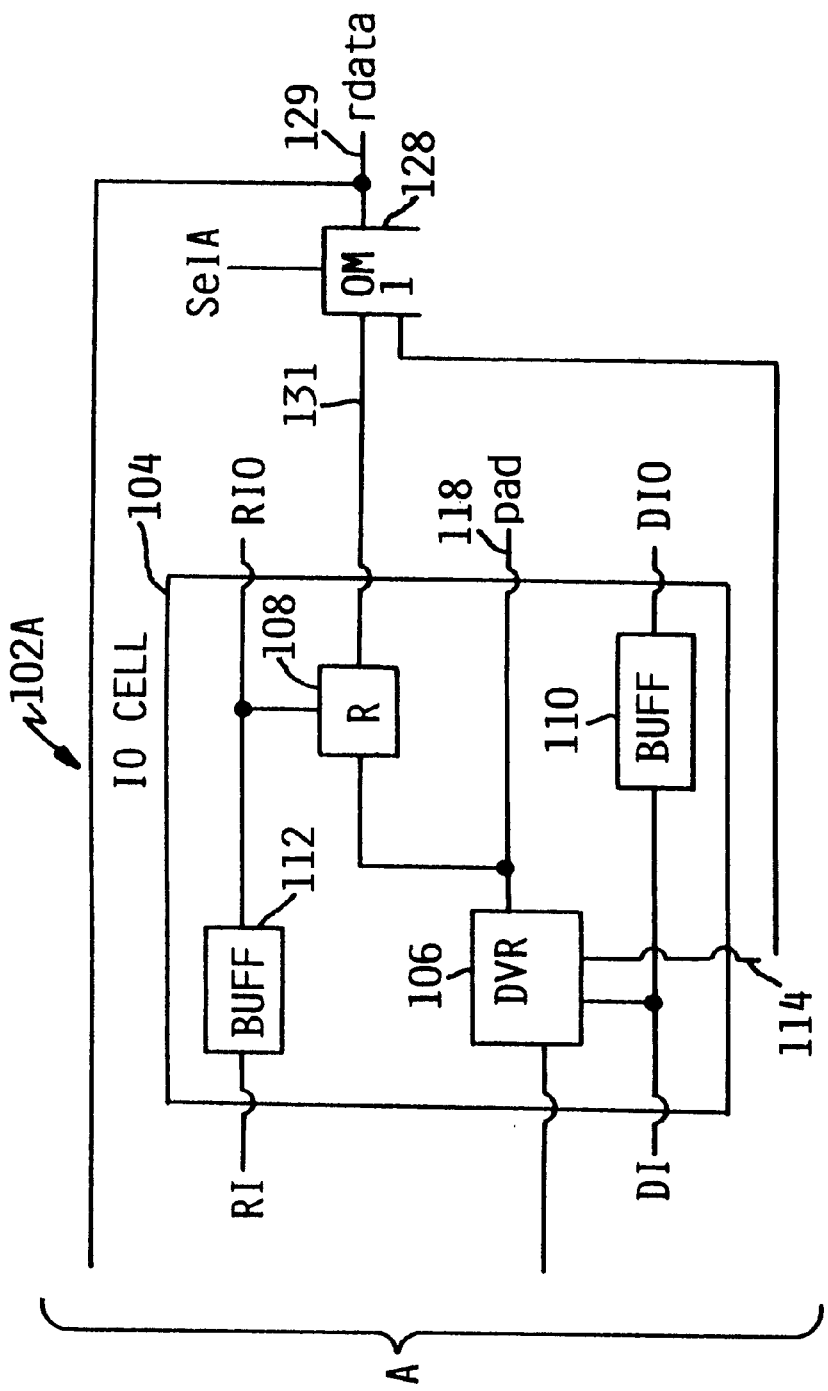
Figures 1, 2B:
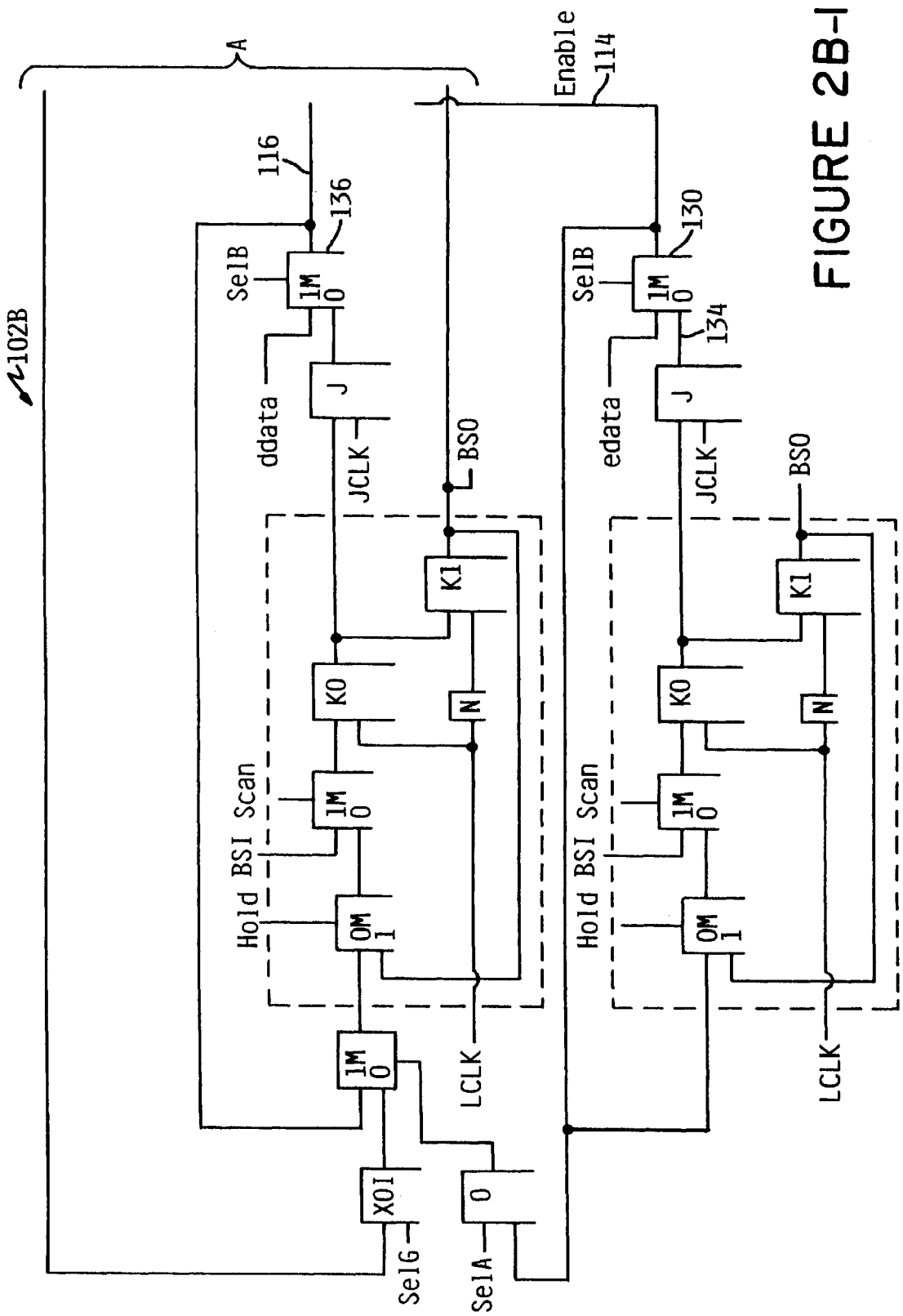
FIG. 2B is a schematic diagram of a boundary scan latch configuration having a Generalized Scan Design (GSD) of FIG. 2 in an INTEST or is RUNBIST mode.
Figures 2, 2B:
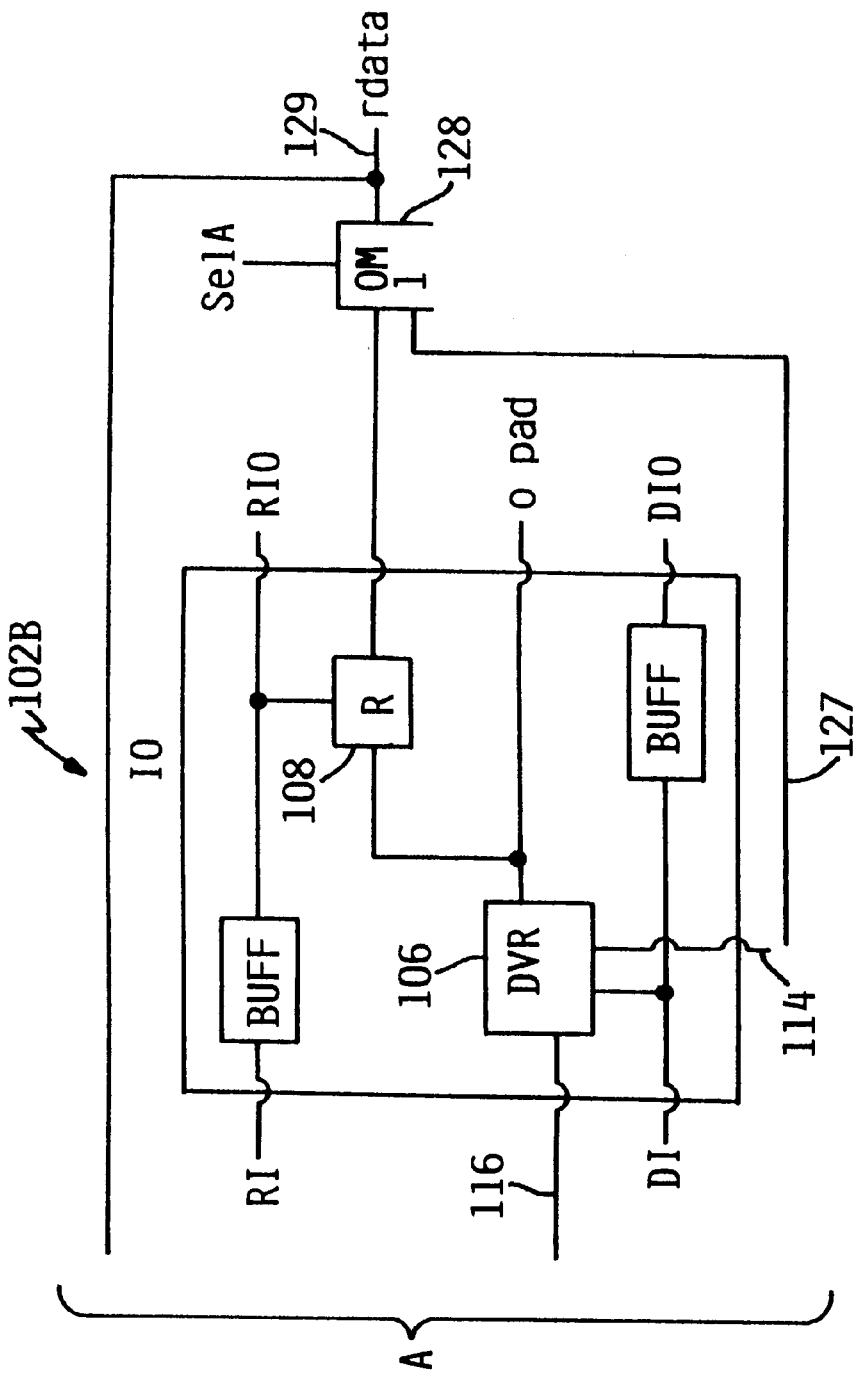
Figures 1, 2C:
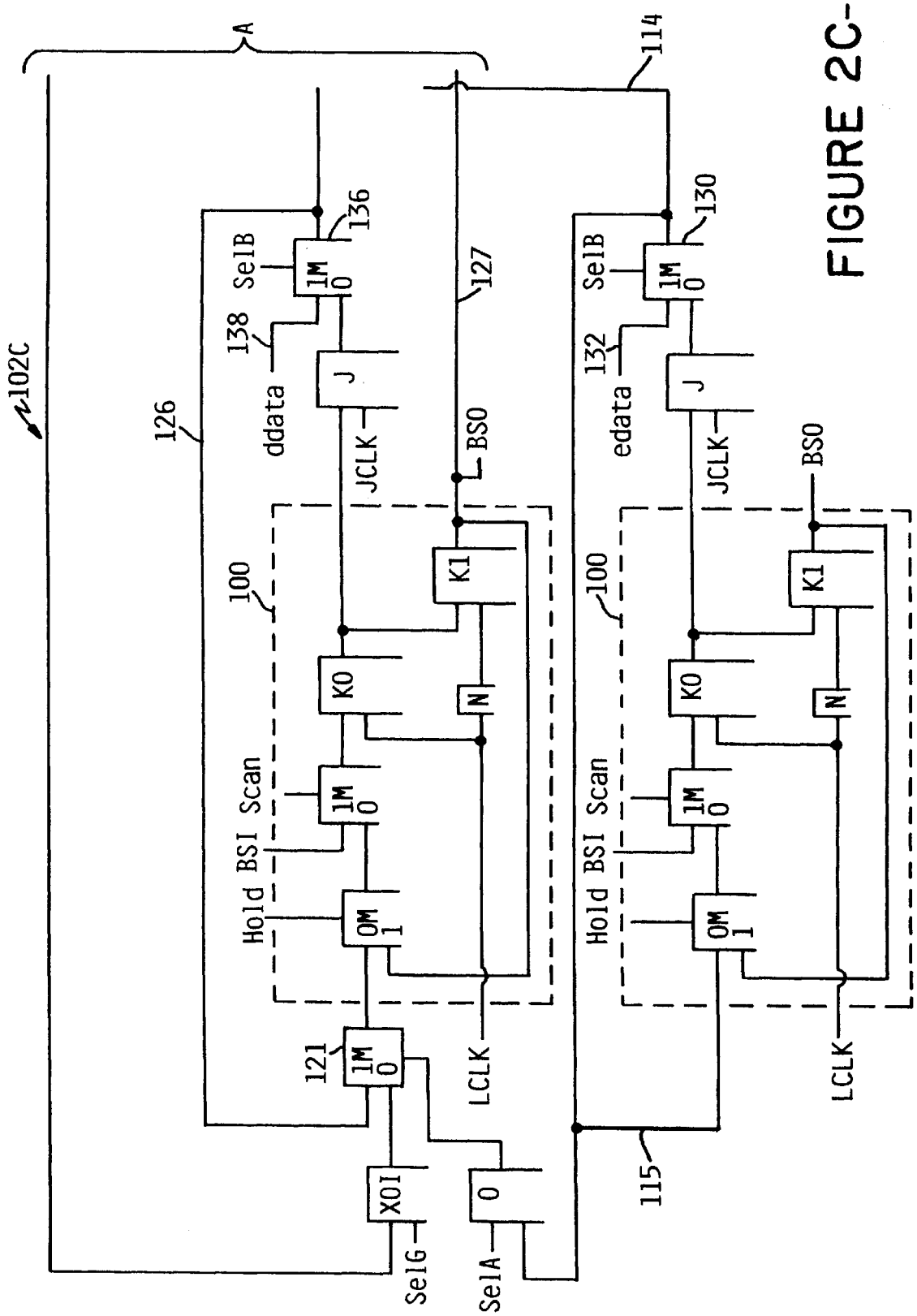
FIG. 2C is a schematic diagram of a boundary scan latch configuration having a Generalized Scan Design (GSD) of FIG. 2 in a LBIST mode.
Figures 2, 2C:
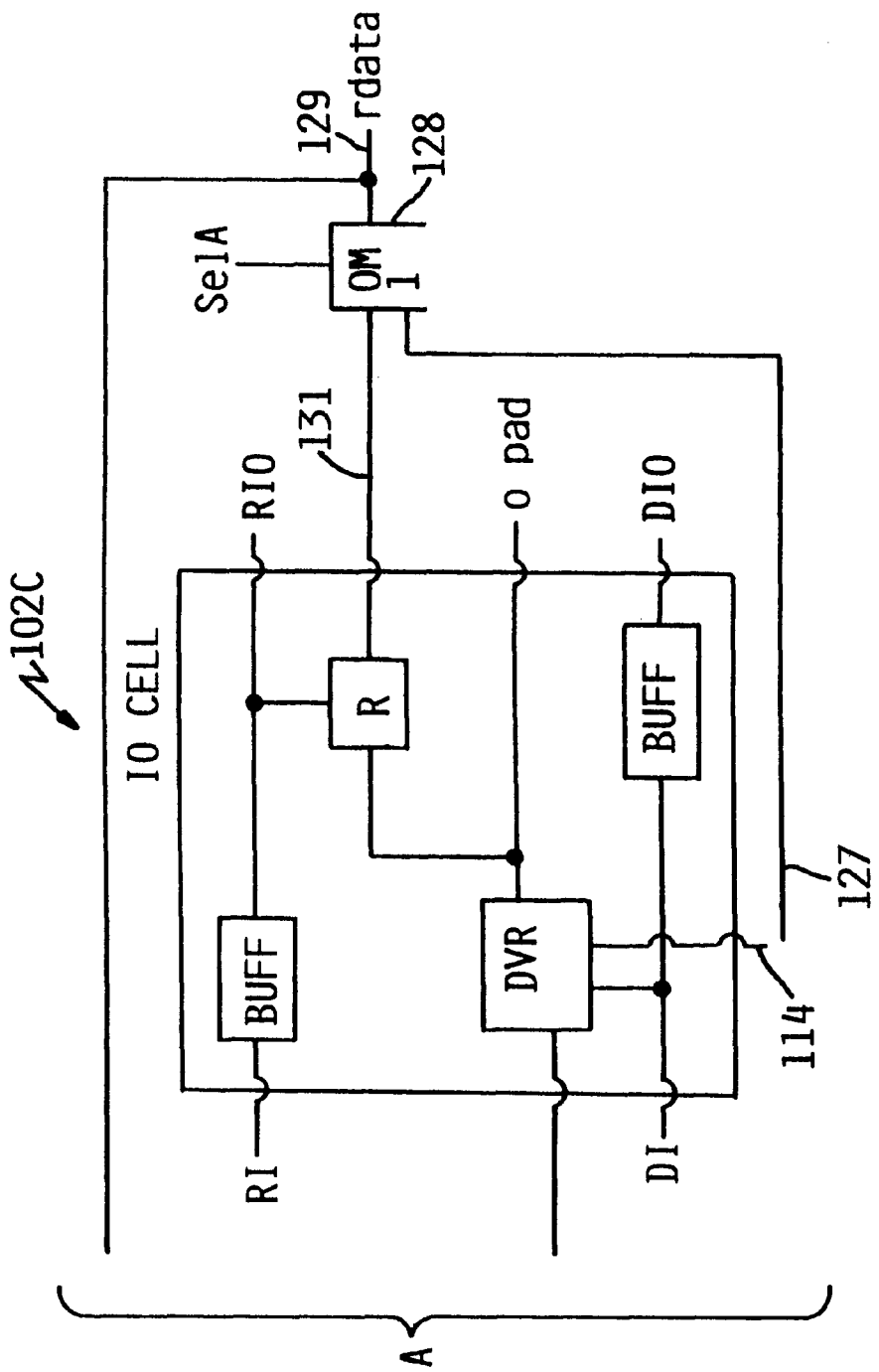
Figures 1, 2D:
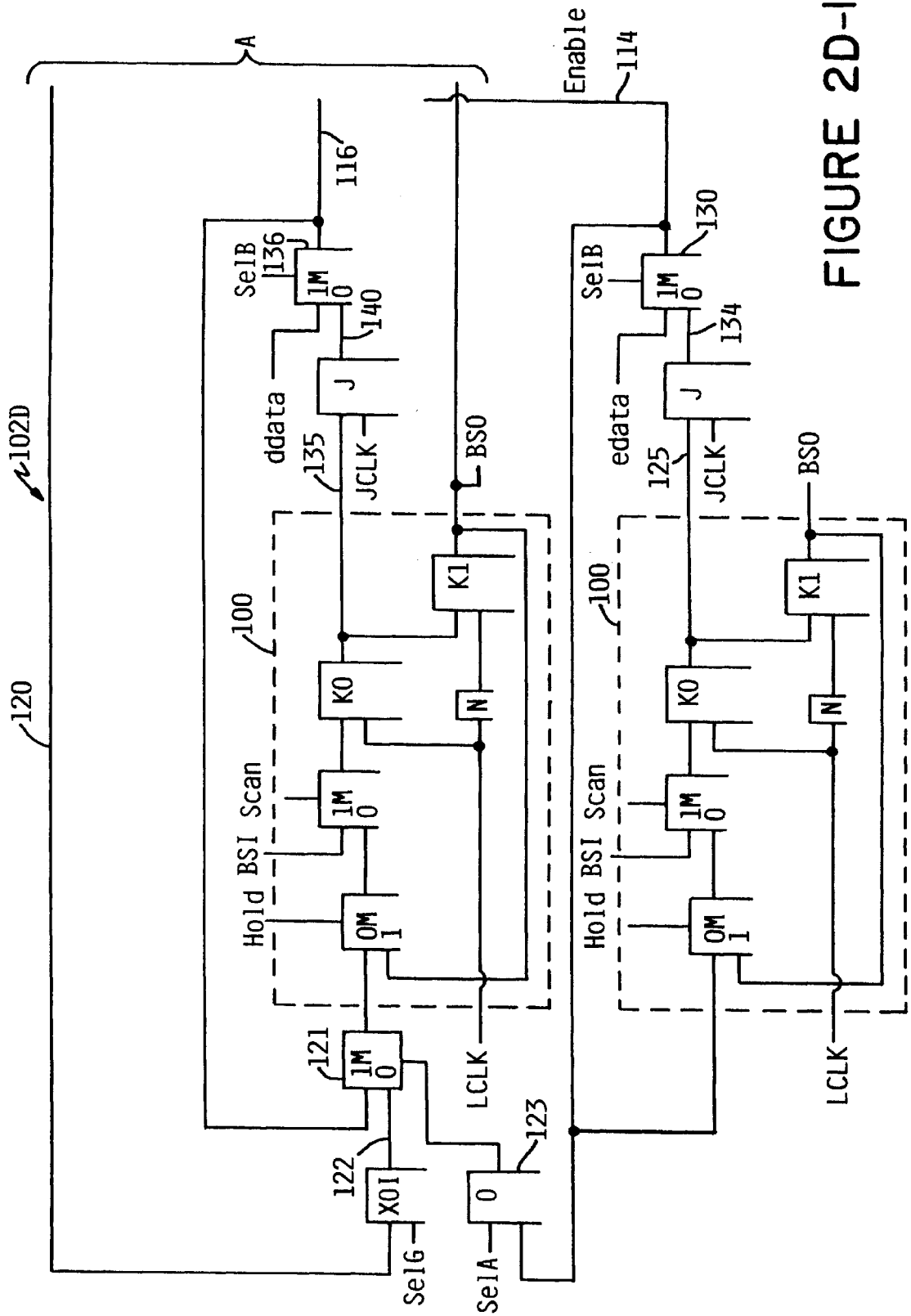
FIG. 2D is a schematic diagram of a boundary scan latch configuration having a Generalized Scan Design (GSD) of FIG. 2 in an EXTEST or WIRETEST mode.
Figures 2, 2D:
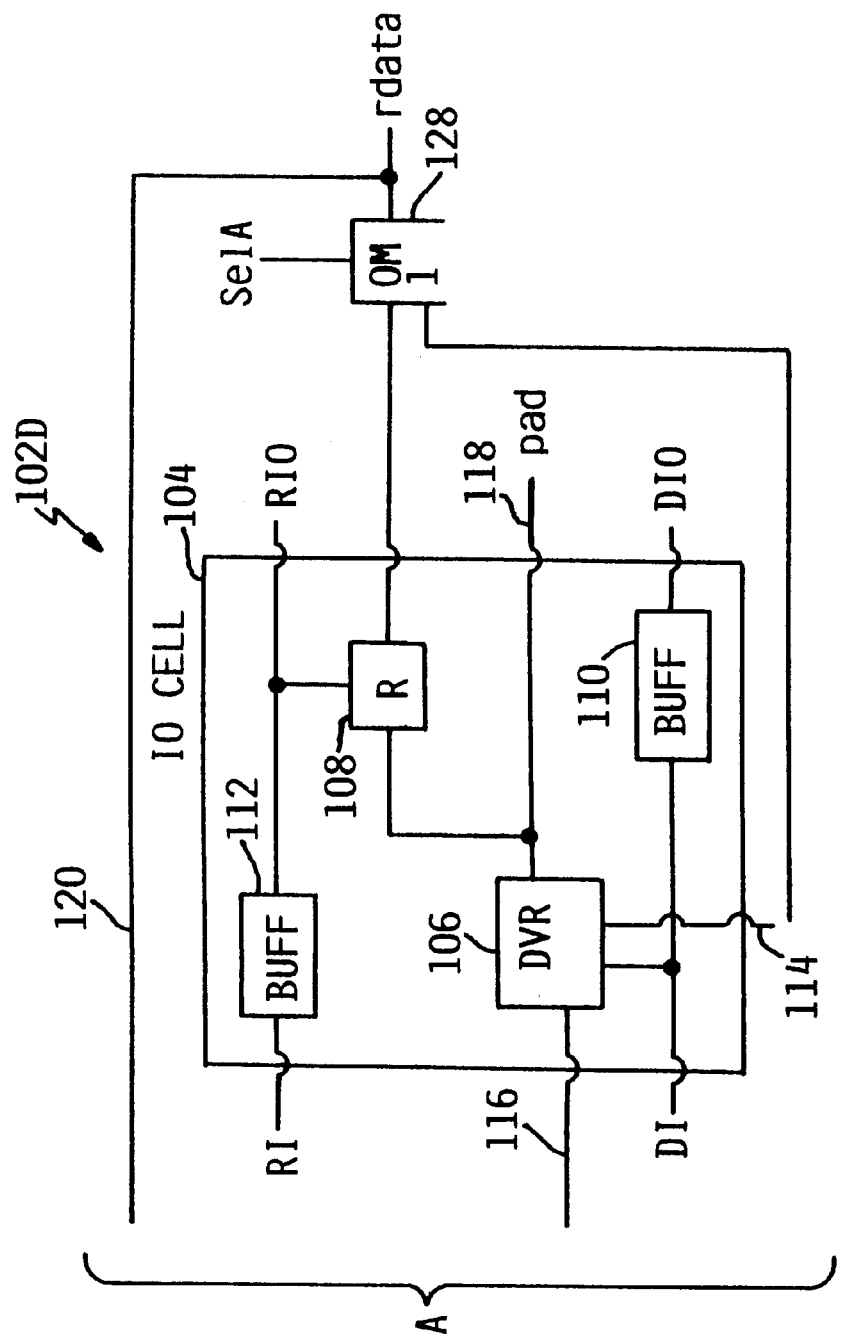
Figures 1, 2E:
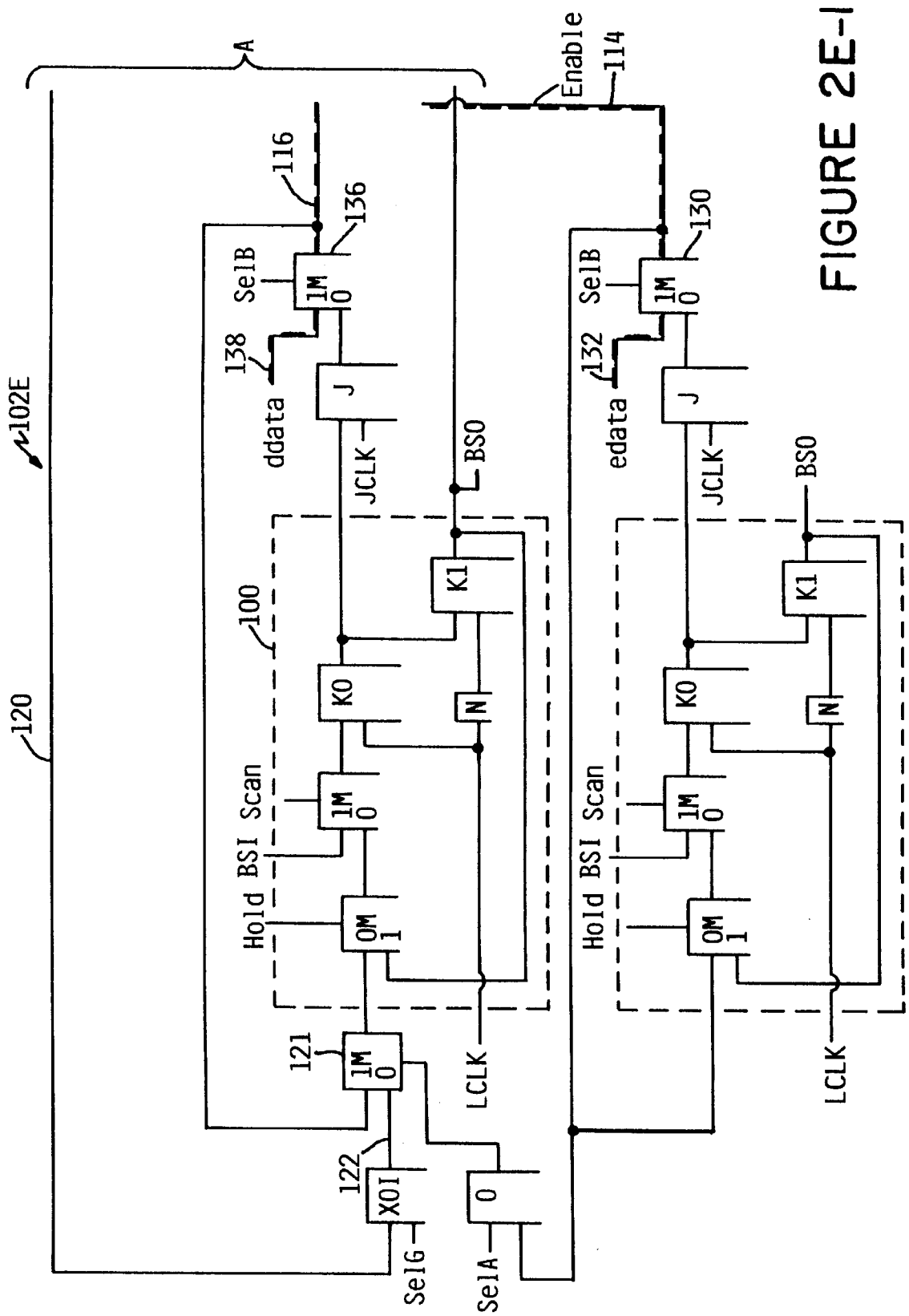
FIG. 2E is a schematic diagram of a boundary scan latch configuration having a Generalized Scan Design (GSD) of FIG. 2 in a SAMPLE/PRELOAD mode.
Figures 2, 2E:
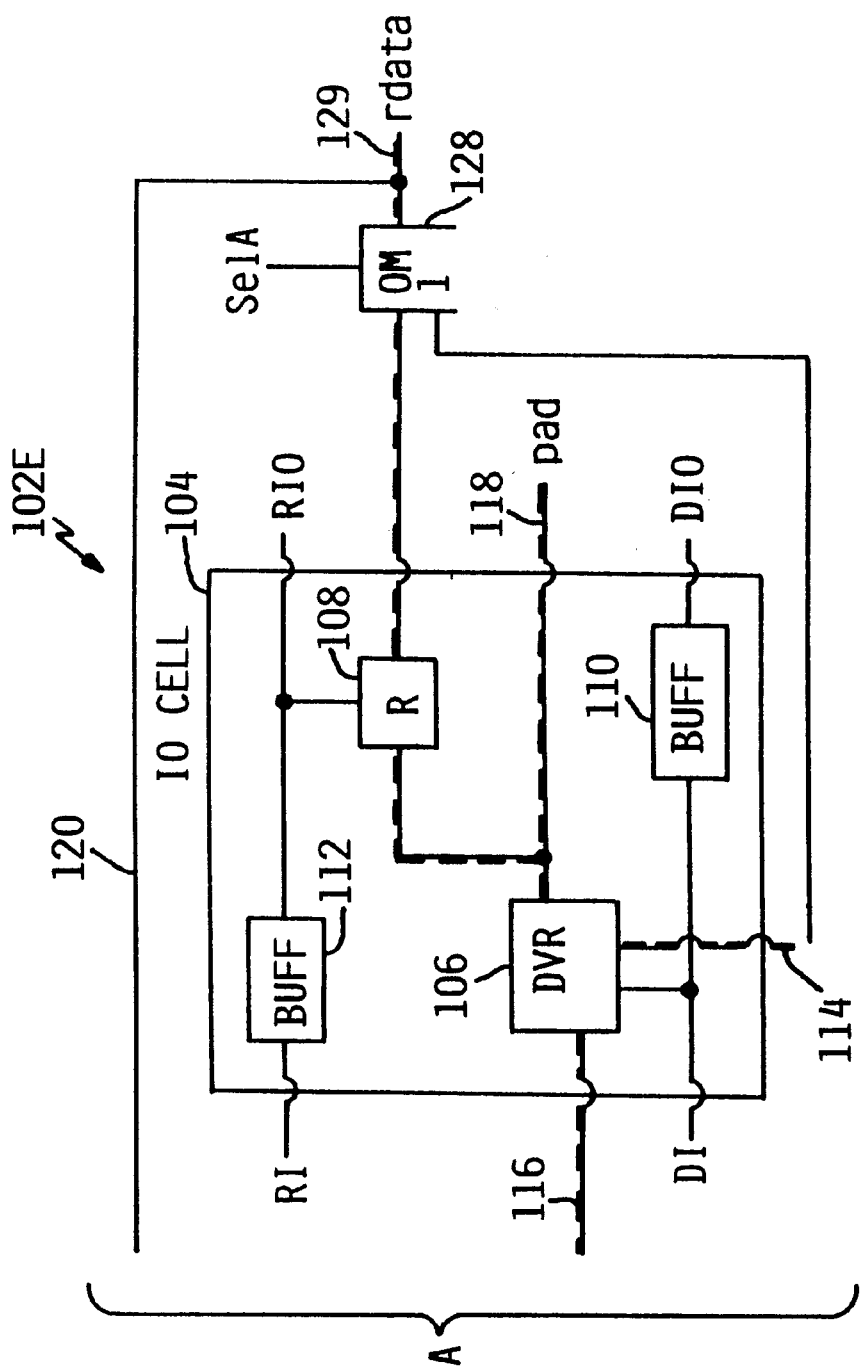

Note that FIG. 2 shows a boundary scan configuration which can be operated in various modes, such as a function mode, an INTEST/RUNBIST mode, a LBIST mode, an EXTEST/WIRETEST mode, a SAMPLE/PRELOAD mode, etc. It is appreciated that in a single operational mode, only a part of the boundary scan configuration 102 may be used. The part, 102A,102B,102C,102D,102E, which is used in different operational modes, is darkened in FIGS. 2A–2E. FIG. 2A shows the boundary scan configuration 102A operated in a function mode. FIG. 2B shows the boundary scan configuration 102B operated in an INTEST/RUNBIST mode. FIG. 2C shows the boundary scan configuration 102C operated in a LBIST mode. FIG. 2D shows the boundary scan configuration 102D operated in an EXTEST/WIRETEST mode. FIG. 2E shows the boundary scan configuration 102C operated in a SAMPLE/PRELOAD mode.

In FIG. 2A, the operational path of the function mode is darkened. The function mode is a normal customer use mode. The driver data ddata may be selected by the MUX 136 under the control signal SelB and outputted on line 116. The ddata is then sent to the driver 106 of the IO cell 104 and outputted at the pad on line 118. The enable data edata may be selected by the MUX 130 under the control signal SelB and outputted on line 114 to control the driver 106 in the IO cell 104. Receiver data may be inputted into the receiver 108 via the pad on line 118. The receiver data on line 131 is then selected by the MUX 128 under the control signal SelA and outputted to the rdata on line 129. Note that DI and RI are also controlled to enable the driver 106 and receiver 108, respectively.

In FIG. 2B, the operational path of the RUNBIST/INTEST mode is darkened. The RUNBIST/INTEST is a type of test function which allows the testing of logic units on chip. It is appreciated that other similar modes in accordance with the present invention can also be used. The data from the J latch is selected by the control signal SelB at the MUX 136 to be driven out of the chip. Further, the data from the J latch is selected by the control signal SelB at the MUX 130 to enable the driver 106. In addition, the data from the K1 latch is sent to the chip via the MUX 128 selected by the control signal SelA. Note that DI is controlled to enable the driver 106 and RI may optionally disable the receiver 108.

In FIG. 2C, the operational path of the LBIST mode is darkened. The LBIST is a type of test function which allows the testing of logic units on chip. It is appreciated that other similar modes in accordance with the present invention can also be used. The driver data ddata is selected by the MUX 136 under the control signal SelB and feedback to the MUX 121 via line 126. The ddata is then scanned via the corresponding GSD and BSO. In addition, the enable data edata is selected by the MUX 130 under the control signal SelB and feedback to the first MUX of the corresponding GSD 100 via line 115. The edata is then scanned out via BSO line. In addition, rdata is driven during the LBIST mode starting at K1 latch through MUX 128 selected by the central signal SelA. Note that DI is controlled to disable the driver 106 and RI may optionally disable the receiver 108.

In FIG. 2D, the operational path of the EXTEST/WIRETEST mode is darkened. The EXTEST is a mandatory Standard function which tests off-chip paths. The WIRETEST is also a type of test functions which allows the testing of off-chip paths. The function of the WIRETEST and EXTEST modes is similar as far as the boundary scan configuration concern. Accordingly, both modes are explained together. It is appreciated that other similar modes in accordance with the present invention can also be used. The J box latched data is selected by the MUX 136 under the control signal SelB and inputted into the driver 106. The data is outputted to the pad via line 118. Meanwhile, the driver 106 is enabled via line 114 from the enable path. The IO cell 104 receives data at the receiver 108 via pad on line 118. The data is then selected by the MUX 128 and feedback to the XOI to be selected by the MUX 121. The data is next latched by K0 latch of the GSD 100. It is appreciated that OR123 may be dropped if the EXTEST mode is not required. This also enables WIRETEST to wrap the data through the IO cell 104 for better testing. Optionally WIRETEST could degate signal 124 (see FIG. 2) from the OR123 for added wrap testing. Note that RI and DI are controlled to enable the driver 106 and the receiver 108, respectively.

In FIG. 2E, the operational path of the SAMPLE/PRELOAD mode is darkened while the functional path is dotted. The SAMPLE/PRELOAD is a mandatory Standard function which allows taking a snapshot of the normal operation of the chip. It is appreciated that other similar sample or preload modes in accordance with the present invention can also be used. The functional path is similar to that shown in FIG. 2A except that the sampled functional data is sent out through the GSD 100 and the BSO. Further, based on the value of edata routed to MUX 121 via OR123 and MUX 130, either rdata is sampled through XOI when the IO cell 104 is not enabled or ddata is sampled when the IO cell 104 is enabled. The sampled data is then scanned out of the GSD 100 at the BSO for analysis. Note that RI and DI are controlled as in the function mode shown in FIG. 2A.

Figure 3A:
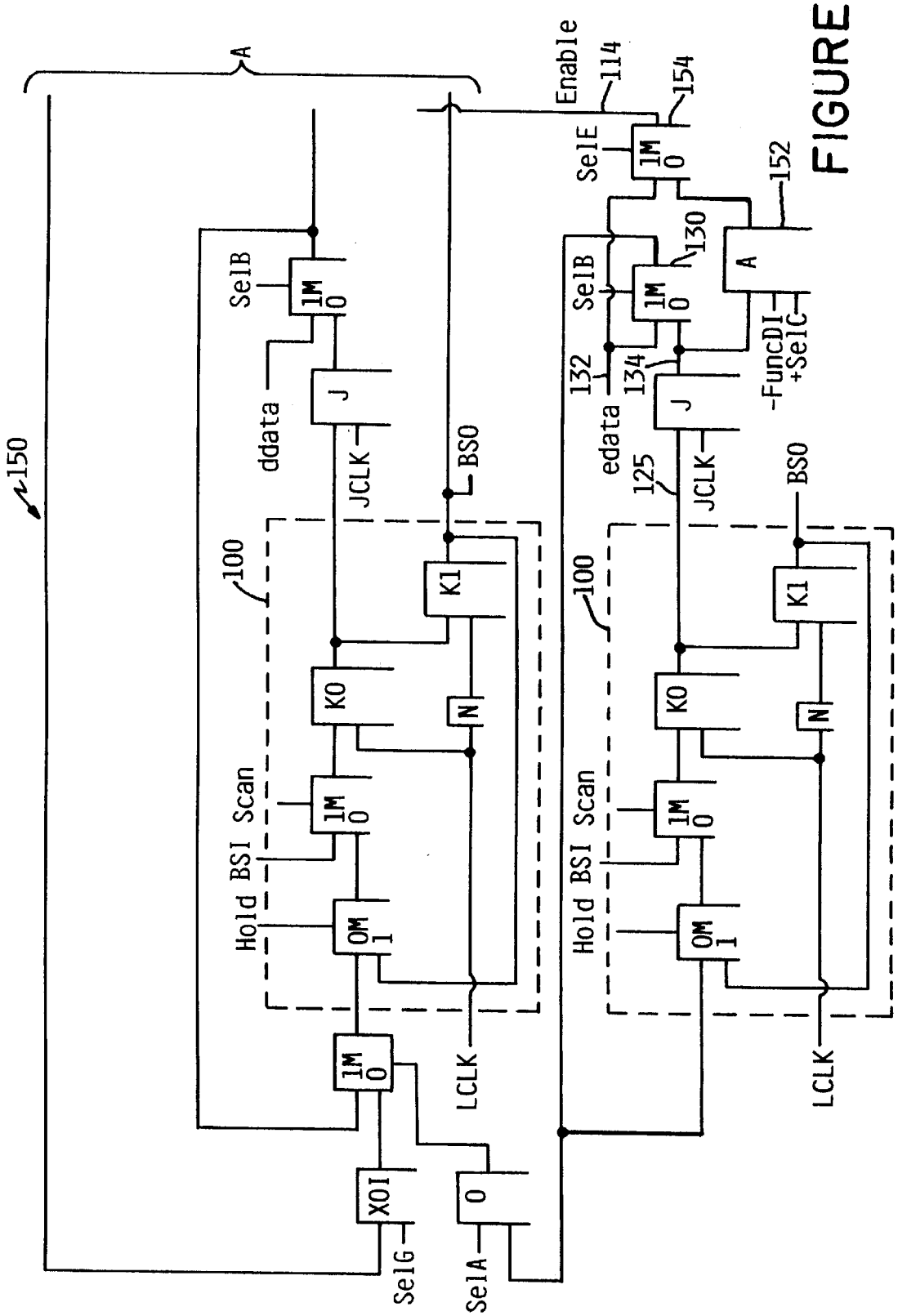
FIG. 3 is a schematic diagram of a boundary scan latch configuration having a GSD CIO sharing with a Test Function Input (TFI) in accordance with the present invention.
Figure 3B:
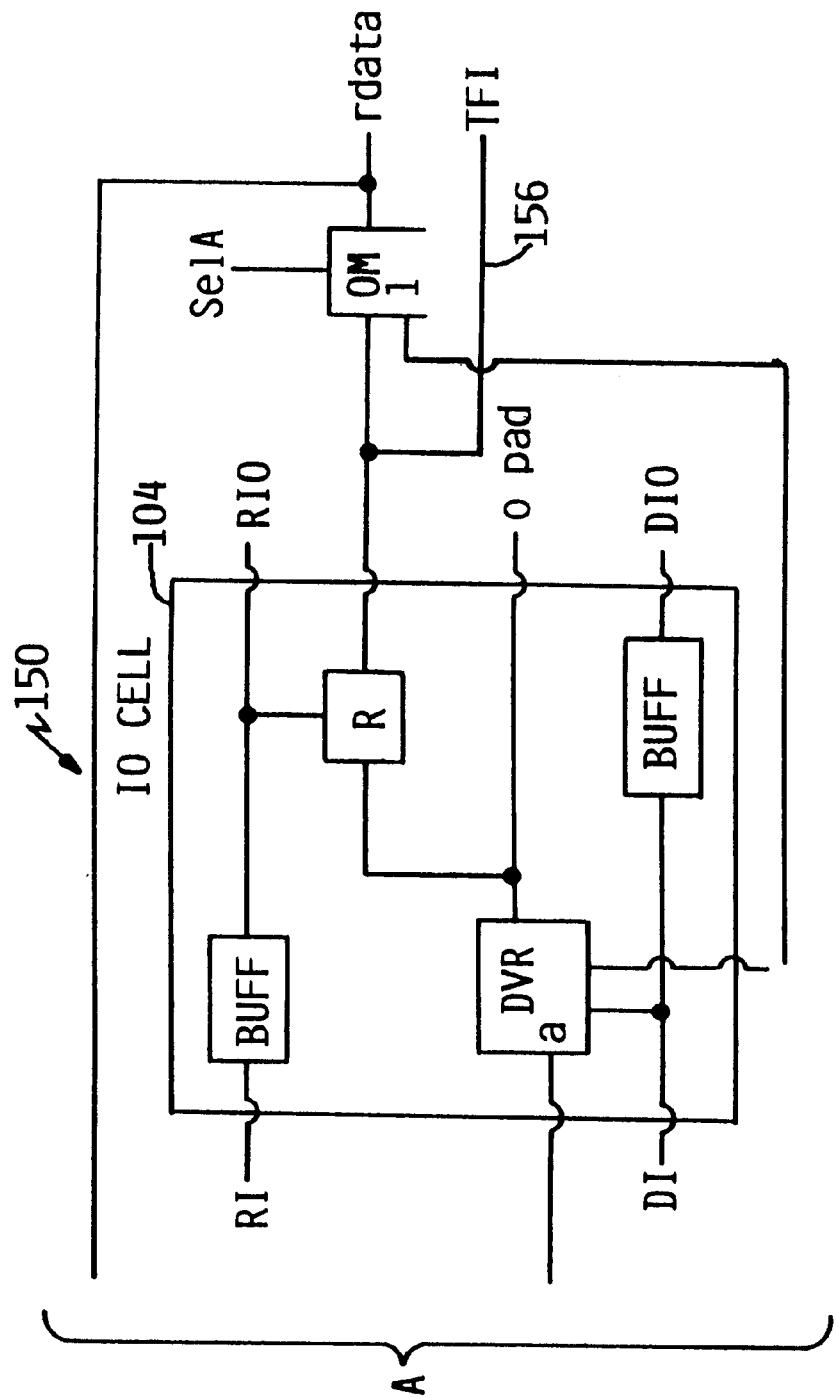

FIG. 3 shows a boundary configuration 150 having a GSD CIO of FIG. 2 sharing with a Test Function Input (TFI) in accordance with the present invention. The enable may control any number of drivers with the same functional and test enable needs. Additional to the same functions discussed in FIG. 2, the boundary configuration 150 has an AND gate 152 and a MUX 154 on the enable path and a TFI path 156.

The MUX 154, controlled by a SelE control signal, routes the data to the driver 106 of the IO cell 104 either from edata during the SAMPLE/PRELOAD mode or the function mode, or from the AND gate 152 otherwise.

The AND gate 152 routes the boundary latch GSD 100 via the J box latch to the MUX 154, when the control signal SelC is active (during the INTEST/RUNBIST or the WIRETEST/EXTEST mode) and a FUNCDI line is inactive. The FUNCDI line is active when the respective driver is inhibited during the LBIST mode. The FUNCDI line may be dropped if the DI input to the IO cell 104 is under the same functional control as those in the non-shared CIO boundary configuration shown in FIG. 2. In FIG. 3, the RI is controlled such that the receiver 108 must always be enabled in a tester mode. This allows the TFI path while other receivers on the chip are inhibited.

The TFI signal is routed to an appropriate test function within the chip. The appropriate function may include things like: scan data inputs, test clocks, test controls, etc.

Figure 4B:
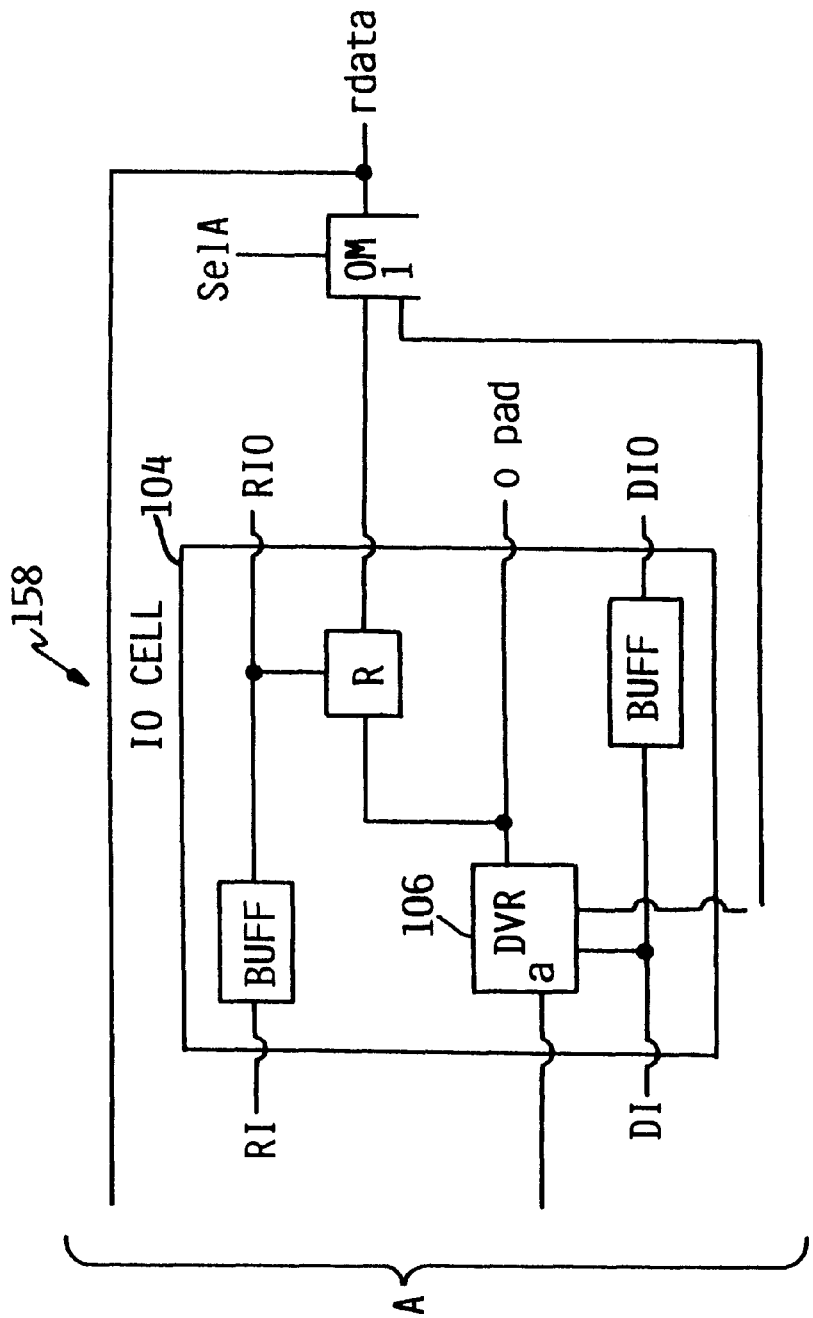
FIG. 4 is a schematic diagram of a boundary scan latch configuration having a GSD CIO sharing with Test Function Output (TFO) in accordance with the present invention.

FIG. 4 shows a boundary scan latch configuration 158 having a GSD CIO of FIG. 2 sharing with a Test Function Output (TFO) in accordance with the present invention. The enable may control any number of drivers with the same functional and test enable needs. Additional to the same functions discussed in FIG. 2, the boundary configuration 158 has a MUX 159, an AND-OR gate 160, and a MUX 162 on the enable path and a TFO path 164.

The MUTX 159, controlled by a control signal SelC, routes data to a MUX 166 either from the boundary latch GSD 100 via the J box latch when an EXTEST, WIRETEST, RUNBIST or INTEST mode is operated, or from a TFO path 164 otherwise. The MUX 166, controlled by a control signal SelD, routes data to the driver 106 of the IO cell 104, either from ddata during a function mode or a SAMPLE/PRELOAD mode, or from the MUX 159 otherwise.

On the enable path, the MUX 162, controlled by a control signal SelE, routes data to control the driver 106, either from edata during a function mode or a SAMPLE/PRELOAD mode, or from an AND-OR gate 160 otherwise. The AND-OR gate 160 allows data from the J box latch when the control signal SelC is active and the FUNCDI signal is inactive or forced a "0" when FUNCDI and SelC are both active. Or, the AND-OR gate 160 forces a '1' down the enable path otherwise to always enable the driver 106.

In FIG. 4, the IO cell 104 is the same as shown in FIG. 2, except that the DI input needs to be controlled so that the TFO signals can reach the IO cell 104, even when the rest of the chips drivers are inhibited. It is appreciated that with some further control of DI, the AND-OR gate 160 could be reduced, even to the point where the MUX 162 and the MUX 130 could be combined. Generally, the TFO signals contain test functions like: scan out, array diagnostic outputs, etc.

As discussed above, FIG. 5 shows a TFI-Shared boundary scan Receiver-Only (RO) GSD. FIG. 5 shows a Test function Input (TFI) sharing GSD Receiver-Only (RO) boundary scan configuration. The operations of this configuration are similar to those in FIG. 3. The MUX 128 routes the received data from the receiver 108, to the XOI or a simple inverter via line 120. The GSD CIO sharing with TFI or TFO (Test Function Output) has been discussed in detail in FIGS. 3 and 4. Further, if the TFI function is used, the RI control must either be dropped or controlled to always allow the receive path during a test. Similarly, a TFO-Shared boundary scan Driver-Only (DO) GSD can be similarly arranged and configured with the principles of the present invention.

The following table summarizes the control signals discussed above:

| | SelA | SelB | SelC | SelD | SelE | FUNCDI | SelF | SelG |
| --- | --- | --- | --- | --- | --- | --- | --- | --- |
| function | 0 | 1 | x | 1 | 1 | x | x | x |
| EXTEST | 0 | 0 | 1 | 0 | 0 | 0 | x | 0 |
| LBIST | 1 | 1 | x | x | 0 | 1 | 1/0 | x |
| WIRETEST | 0 | 0 | 1 | 0 | 0 | 0 | x | 1 |
| SAMPLE/PRELOAD | 0 | 1 | x | 1 | 1 | x | x | 0 |
| INTEST/RUNBIST | 1 | 0 | 1 | 0 | 0 | 0 | 1/0 | x |
| other testers | x | x | 0 | 0 | 0 | 0/1 | x | x | x refers to "don't care", and 1/0 refers to the signal toggling to either value "1" or "0" during the mode. Other testers refer to other testing devices from outside which test the chip.

x refers to "don't care", and 1/0 refers to the signal toggling to either value "1" or "0" during the mode. Other testers refer to other testing devices from outside which test the chip.

Figure 6A:
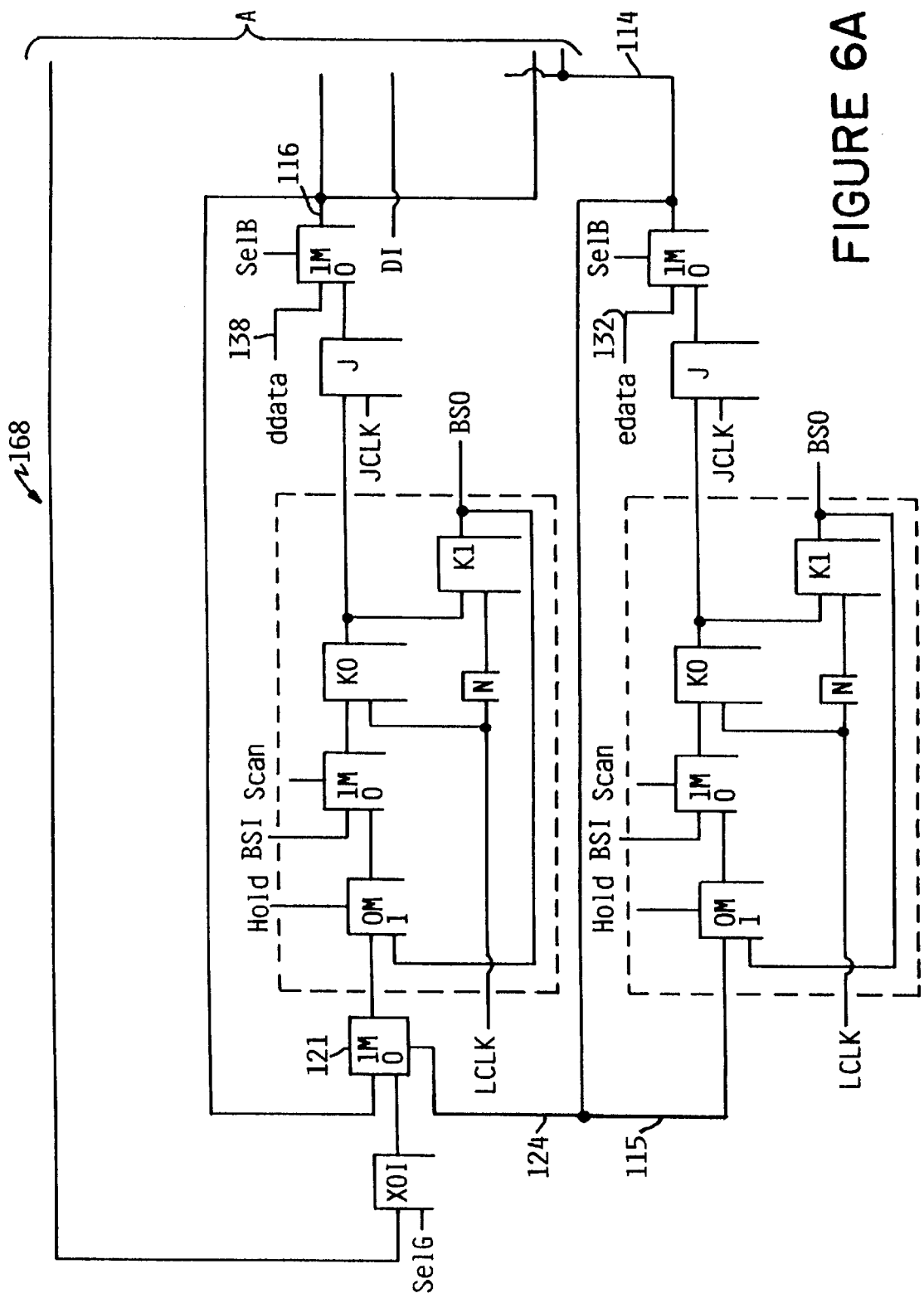
FIG. 6 is a schematic diagram of a second embodiment of a boundary scan latch configuration having a GSD CIO in accordance with the present invention.
Figure 6B:
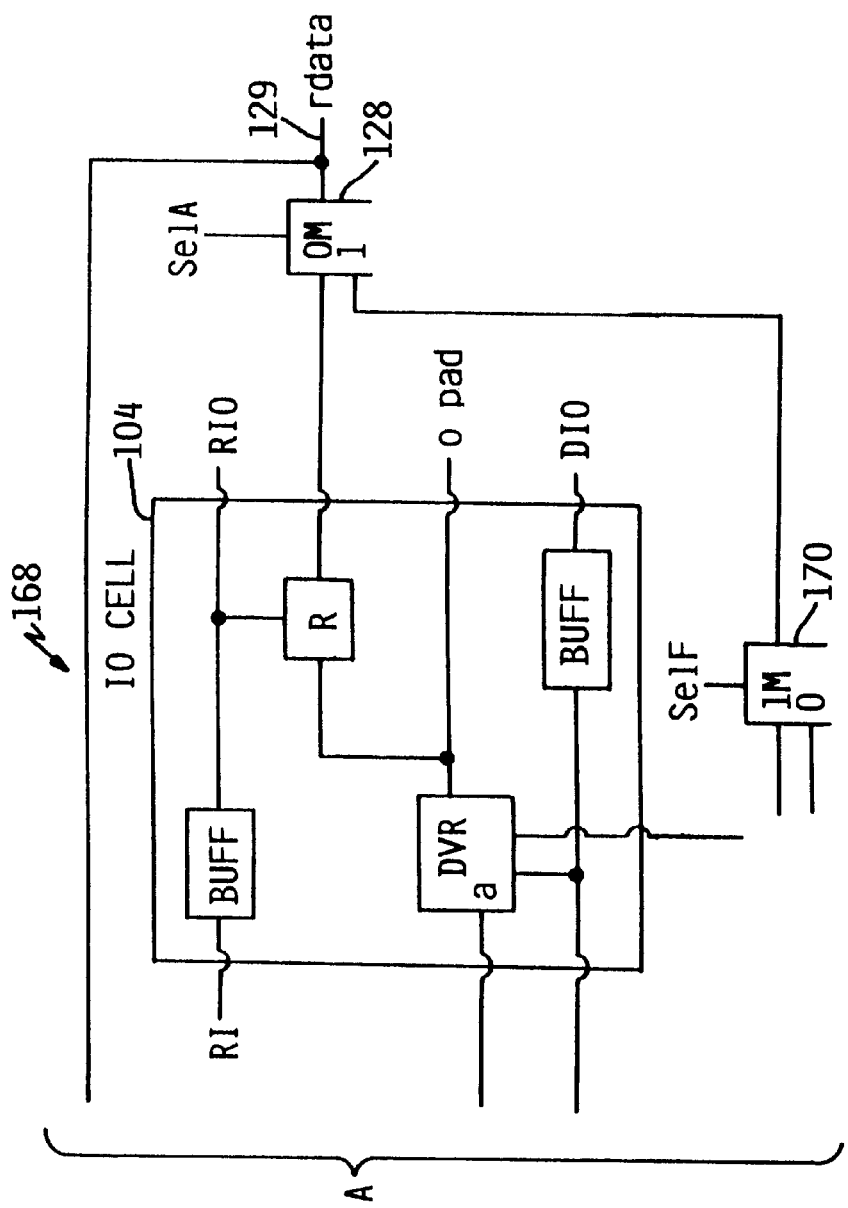

FIG. 6 illustrates a second embodiment of a boundary configuration 168 having a GSD CIO in accordance with the present invention. The implementation is similar to those in FIG. 2 with several exceptions. The MUX 121 previously controlled by the OR 123 of FIG. 2 is now directly controlled by the enable control input from line 124.

A MUX 170, controlled by a control signal SelF, selects the driver data line 116 or the enable path on line 114 and routes the data to the MUX 128 during the LBIST, RUNBIST, or INTEST mode. This MUX 170 could be reduced to an AND or OR gate and still maintain an internal test coverage. It is appreciated that during RUNBIST and INTEST modes, better test coverage may be attained by replacing the line 116 entering the MUX 170 with line 138, and replacing the line 114 entering the MUX 170 with the edata line 132. However, the edata or ddata now directly drives the rdata during the LBIST, RUNBIST, or INTEST mode. This simplifies the LCLK clock design, but it may be a trade-off in a timing path design.

It is appreciated that in one embodiment, while the enable path may still be shared with the driver path, the MUX 170 with the SelF control is arranged to select one of the edata paths within the principles of the present invention.

One advantage of the second embodiment of the present invention is that the LCLK no longer requires the internal system clock and can be just derived from the TCK, since the Boundary Scan Latches 100 no longer participate (neither drive nor receive) in LBIST, RUNBIST, or INTEST, etc., modes.

Figure 7A:
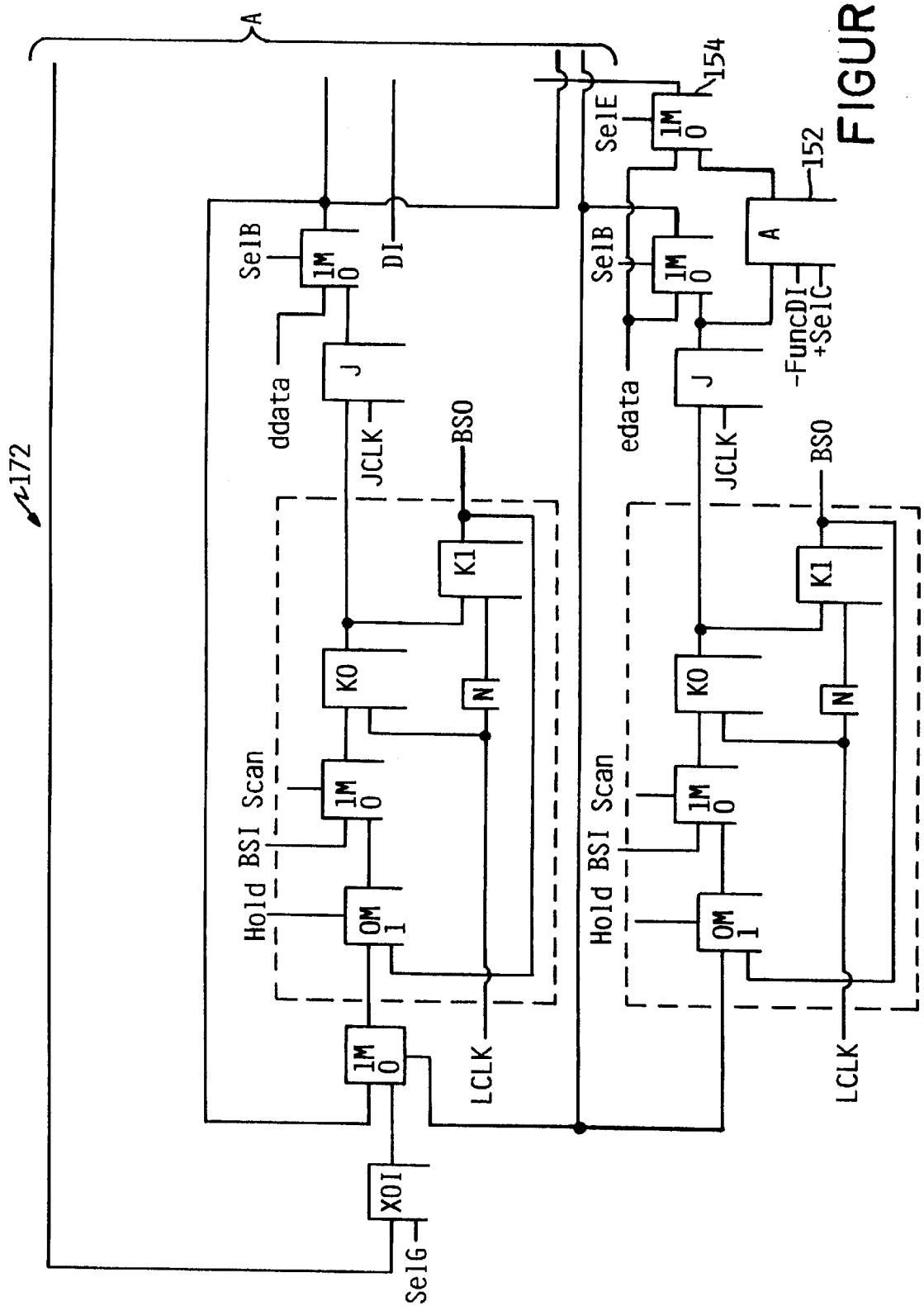
FIG. 7 is a schematic diagram of the second embodiment of a boundary scan latch configuration having a GSD CIO sharing with a Test Function Input (TFI) in accordance with the present invention.
Figure 7B:
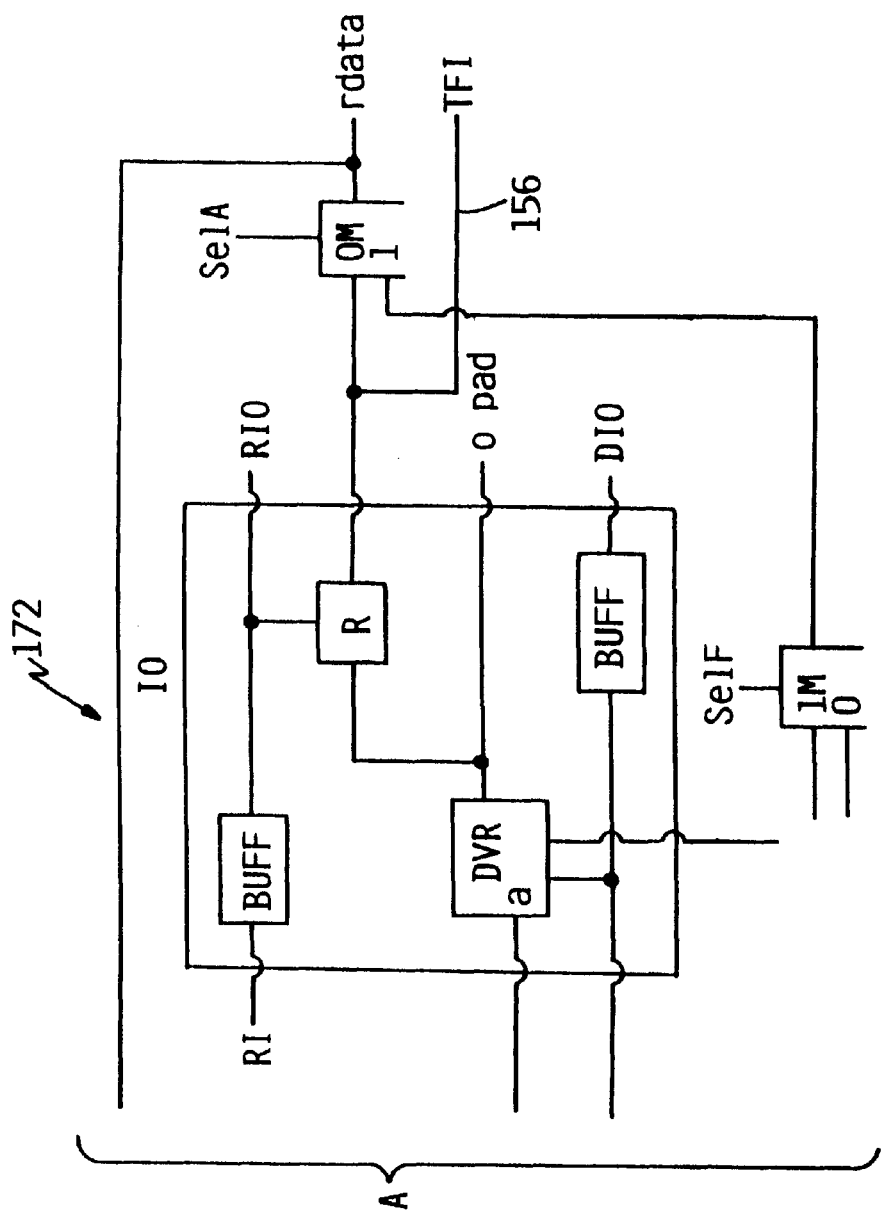
Figure 8A:
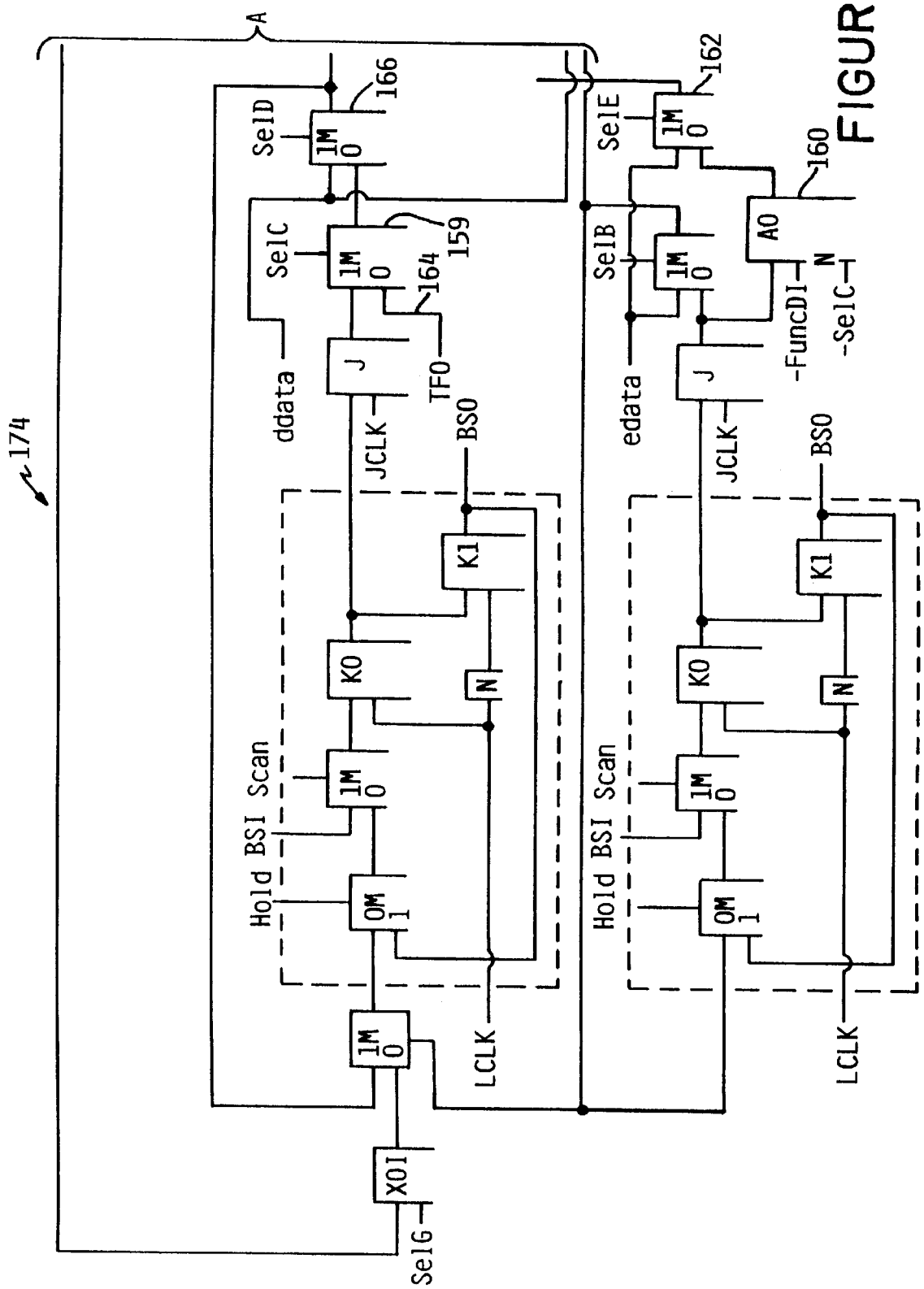
FIG. 8 is a schematic diagram of the second embodiment of a boundary scan latch configuration having a GSD CIO sharing with Test Function Output (TFO) in accordance with the present invention.
Figure 8B:
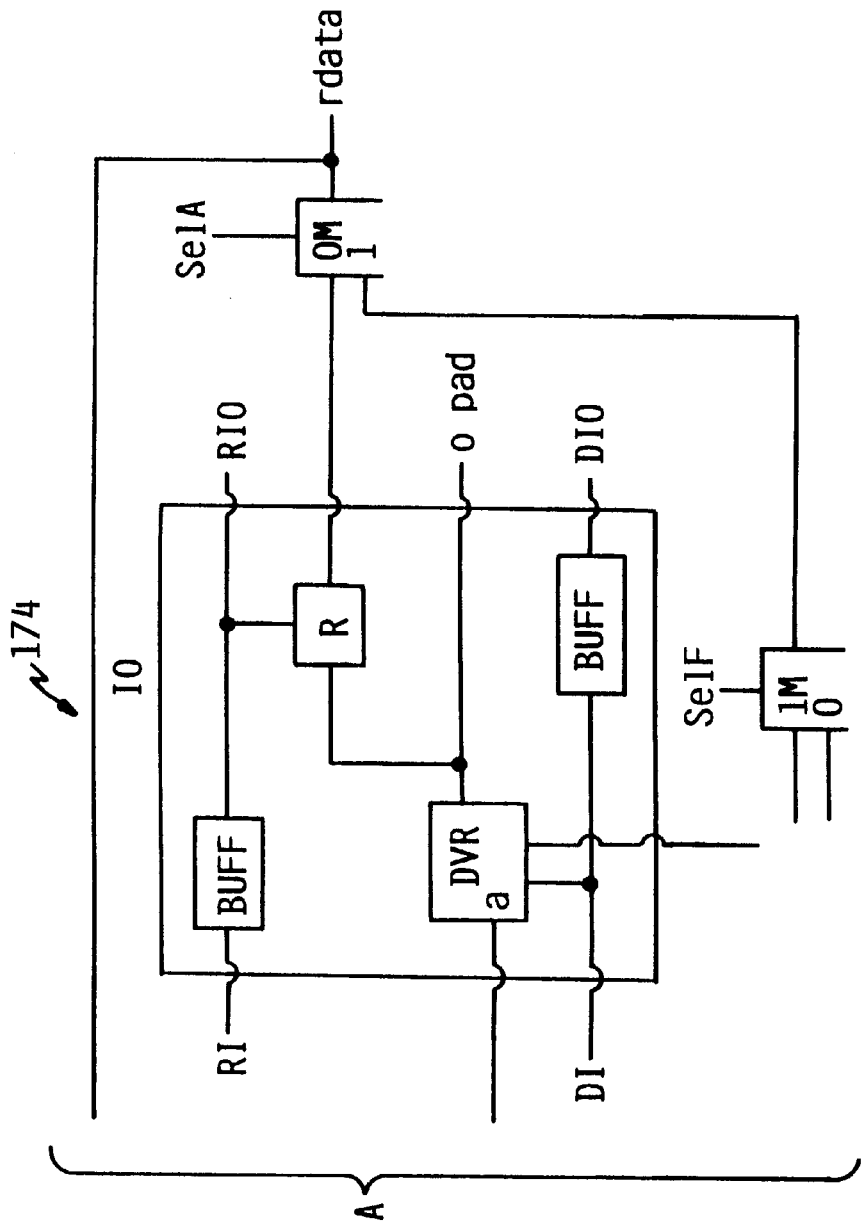

It is appreciated that the same modifications for TFI and TFO sharing with the second embodiment of the GSD CIO as those shown in FIGS. 3 and 4 can be used within the principles of the invention. FIG. 7 illustrates one implementation of the second embodiment of the GSC CIO 172 sharing with a Test Function Input (TFI) in accordance with the present invention. FIG. 8 illustrates one implementation of the second embodiment of the GSD CIO 174 sharing with a Test Function Output (TFO) in accordance with the present invention. The added AND gate 152, the MUX 154, and the TFI line 156 in FIG. 7 are the same as those in FIG. 3. The added AND gate 160, the MUX 162, the MUX 159, the MUX 166, and the TFO line 164 in FIG. 8 are the same as those in FIG. 4.

The present invention has been described in its presently contemplated best mode, and it is clear that it is susceptible to various modifications, modes of operation and embodiments, all within the ability and skill of those skilled in the art and without the exercise of further inventive activity. Further, while the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

What is claimed is:

1. A boundary circuit of a chip having a system clock distributed throughout the chip, the boundary circuit comprising:
   (a) at least one generalized scan design internal latch, the internal latch comprising a first shift register latch, a second shift register latch, and a scan data input;
   (b) a boundary scan clock input coupled to the internal latch and to the system clock, the first and second shift register latches toggling in response to the system clock to scan data provided at the scan data input through the internal latch;
   (c) an input/output cell coupled to the internal latch; and
   (d) at least one control line coupled between the internal latch and the input/output cell.

2. The boundary circuit of claim 1, wherein the first and second shift register latches are controlled by the boundary scan clock input and a scan/hold control signal.

3. The boundary circuit of claim 1, farther comprising an inverter is connected between the input/output cell and the latch.

4. The boundary circuit of claim 1, wherein the at least one control line controls a function mode, during the function mode, a signal is sent to/from at least one internal logic unit of the chip for a normal functional operation.

5. The boundary circuit of claim 4, wherein the signal is a data signal.

6. The boundary circuit of claim 4, wherein the signal is a control signal.

7. The boundary circuit of claim 1, wherein the at least one control line controls an INTEST/RUNBIST mode, during the INTEST/RUNBIST mode, a signal is scanned via the internal latch and sent to at least one internal logic unit of the chip for a test operation.

8. The boundary circuit of claim 7, wherein the signal is a data signal.

9. The boundary circuit of claim 7, wherein the signal is a control signal.

10. The boundary circuit of claim 1, wherein the at least one control line controls a LBIST mode, during the LBIST mode, a signal is scanned via the internal latch and sent to at least one internal logic unit of the chip for a test operation.

11. The boundary circuit of claim 10, wherein the signal is a data signal.

12. The boundary circuit of claim 10, wherein the signal is a control signal.

13. The boundary circuit of claim 1, wherein the at least one control line controls a LBIST mode, during the LBIST mode, a signal from at least one internal logic unit of the chip is scanned out via the internal latch.

14. The boundary circuit of claim 13, wherein the signal is a data signal.

15. The boundary circuit of claim 13, wherein the signal is a control signal.

16. The boundary circuit of claim 1, wherein the at least one control line controls an EXTEST/WIRETEST mode, during the EXTEST/WIRETEST mode, a signal is scanned into the internal latch and sent to at least one external logic unit for a testing operation.

17. The boundary circuit of claim 16, wherein the signal is a data signal.

18. The boundary circuit of claim 16, wherein the signal is a control signal.

19. The boundary circuit of claim 1, wherein the at least one control line controls an EXTEST/WIRETEST mode, during the EXTEST/WIRETEST mode, a signal from at least one external logic unit is received by the input/output cell and scanned out via the internal latch.

20. The boundary circuit of claim 19, wherein the signal is a data signal.

21. The boundary circuit of claim 19, wherein the signal is a control signal.

22. The boundary circuit of claim 1, wherein the at least one control line controls a SAMPLE/PRELOAD mode, during the SAMPLE/PRELOAD mode, the at least one control line is driven into at least one logic unit of the chip to take a snapshot of a normal functional operation of the chip.

23. The boundary circuit of claim 1, wherein the at least one control line controls a driver of the input/output cell.

24. The boundary circuit of claim 1, further comprising a logic unit, the logic unit being connected to the at least one control line such that a driver of the input/output cell is inhibitable in a test function input sharing operation, an output of a receiver of the input/output cell being shared with a test function input of the chip when the driver is inhibited.

25. The boundary circuit of claim 1, further comprising a logic unit, the logic unit being connected to the at least one control line such that a driver is not inhibitable in a test function output sharing operation, an input of the driver being shared with a test function output of the chip when the driver is not inhibited.

26. The boundary circuit of claim 1, wherein the system clock is derived from a standard clock TCK.

27. The boundary circuit of claim 1, further comprising a MUX controller, the MUX controller selecting data from one of at least two control lines and sending the selected data to at least one internal logic unit of the chip for a test operation.

28. The boundary circuit of claim 27, wherein the system clock is derived from a standard clock TCK.

* * * * *